United States Patent
Chen et al.

(10) Patent No.: US 12,218,197 B2
(45) Date of Patent: Feb. 4, 2025

(54) GATE OXIDE OF NANOSTRUCTURE TRANSISTOR WITH INCREASED CORNER THICKNESS

(71) Applicant: Taiwan Semiconductor Manufacturing Co., Ltd., Hsinchu (TW)

(72) Inventors: Shu-Han Chen, Hsinchu (TW); Yi-Shao Li, Hsinchu (TW); Chun-Heng Chen, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/364,995

(22) Filed: Aug. 3, 2023

(65) Prior Publication Data

US 2023/0378262 A1 Nov. 23, 2023

Related U.S. Application Data

(62) Division of application No. 17/369,452, filed on Jul. 7, 2021, now Pat. No. 11,855,140.

(60) Provisional application No. 63/084,833, filed on Sep. 29, 2020.

(51) Int. Cl.
*H01L 29/06* (2006.01)
*H01L 29/423* (2006.01)
*H01L 29/78* (2006.01)

(52) U.S. Cl.
CPC .... *H01L 29/0665* (2013.01); *H01L 29/42364* (2013.01); *H01L 29/42392* (2013.01); *H01L 29/785* (2013.01); *H01L 2029/7858* (2013.01)

(58) Field of Classification Search
CPC ......... H01L 29/42392; H01L 29/42364; H01L 29/0665; H01L 29/785; H01L 2029/7858; H01L 29/78696; H01L 29/42368; H01L 29/66545; H01L 29/66477
See application file for complete search history.

(56) References Cited

U.S. PATENT DOCUMENTS

| | | | |
|---|---|---|---|
| 6,291,298 B1 | 9/2001 | Williams et al. | |
| 9,853,114 B1 | 12/2017 | Rodder et al. | |
| 10,600,913 B2 | 3/2020 | Chung et al. | |

(Continued)

FOREIGN PATENT DOCUMENTS

| | | |
|---|---|---|
| CN | 109860054 A | 6/2019 |
| KR | 20150033496 A | 4/2015 |

(Continued)

*Primary Examiner* — Changhyun Yi
(74) *Attorney, Agent, or Firm* — Slater Matsil, LLP

(57) ABSTRACT

A device includes a semiconductor nanostructure, and an oxide layer, which includes horizontal portions on a top surface and a bottom surface of the semiconductor nanostructure, vertical portions on sidewalls of the semiconductor nanostructure, and corner portions on corners of the semiconductor nanostructure. The horizontal portions have a first thickness. The vertical portions have a second thickness. The corner portions have a third thickness. Both of the second thickness and the third thickness are greater than the first thickness. A high-k dielectric layer surrounds the oxide layer. A gate electrode surrounds the high-k dielectric layer.

20 Claims, 21 Drawing Sheets

(56) References Cited

U.S. PATENT DOCUMENTS

| | | | |
|---|---|---|---|
| 10,693,017 B2 | 6/2020 | Lee et al. | |
| 11,244,823 B2 | 2/2022 | Liao et al. | |
| 11,444,081 B2 | 9/2022 | Kang et al. | |
| 2008/0057690 A1 | 3/2008 | Forbes et al. | |
| 2016/0141381 A1 | 5/2016 | Kim et al. | |
| 2017/0104060 A1 | 4/2017 | Balakrishnan et al. | |
| 2019/0378906 A1 | 12/2019 | Loubet et al. | |
| 2020/0035563 A1 | 1/2020 | Zhang et al. | |
| 2020/0066839 A1* | 2/2020 | Zhang | H01L 21/823412 |
| 2020/0083219 A1 | 3/2020 | Kang et al. | |
| 2020/0211902 A1 | 7/2020 | Zhang et al. | |

FOREIGN PATENT DOCUMENTS

| | | | |
|---|---|---|---|
| KR | 20170135115 A | 12/2017 |
| KR | 20180050817 A | 5/2018 |
| KR | 20200029264 A | 3/2020 |
| TW | 201828327 A | 8/2018 |
| WO | 2015047317 A1 | 4/2015 |

\* cited by examiner

GATE OXIDE OF NANOSTRUCTURE TRANSISTOR WITH INCREASED CORNER THICKNESS

PRIORITY CLAIM AND CROSS-REFERENCE

This application is a divisional of U.S. patent application Ser. No. 17/369,452, filed Jul. 7, 2021, and entitled "Gate Oxide of Nanostructure Transistor with Increased Corner Thickness," which claims the benefit of the U.S. Provisional Application No. 63/084,833, filed on Sep. 29, 2020, and entitled "Semiconductor Device with Gate-all-around Transistor and Method for Forming the Same," which applications are hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (for example, transistors, diodes, resistors, capacitors, etc.) through continual reduction in minimum feature size, which allows more components to be integrated into a given area. As the minimum feature sizes are reduced, however, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
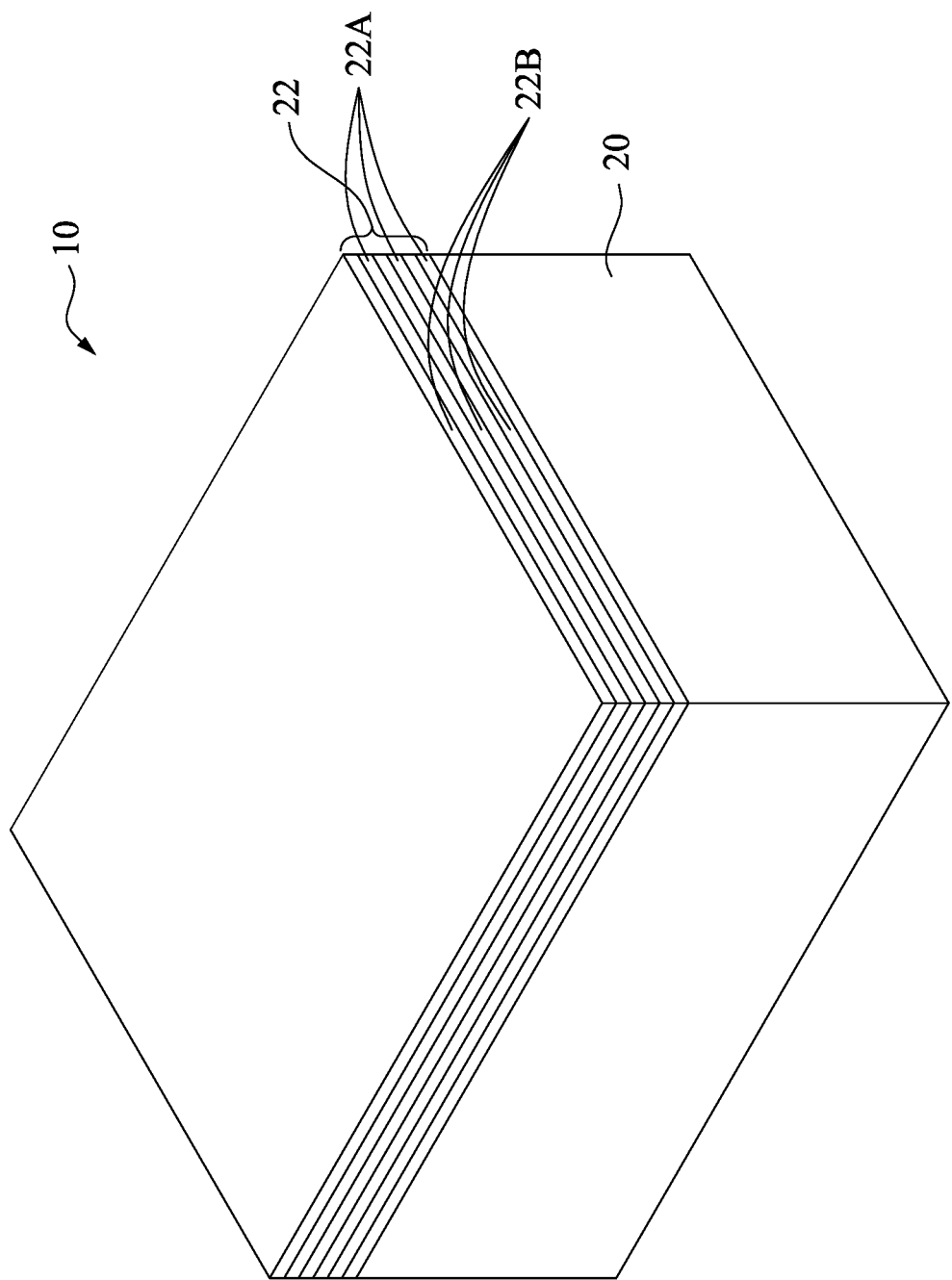
FIGS. 1-4, 5A, 5B, 6A, 6B, 7A, 7B, 8A, 8B, 9A, 9B, 9C, 10A, 10B, 11A, 11B, 12A, 12B, 13A, 13B, 14A, 14B, 15A, 15B, 15C, 16A, 16B, and 16C illustrate the perspective views and cross-sectional views of intermediate stages in the formation of nanostructure transistors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A nanostructure transistor (also referred to as a nano-FET (Field Effect Transistor)), which is also a Gate All Around (GAA) transistor, and the method of forming the same are provided in accordance with some embodiments. In accordance with some embodiments of the present disclosure, the gate oxides of the nano-structure transistors are formed with the vertical portions on the sidewalls of the nano-structures being thicker than the horizontal portions on the top surfaces and bottom surfaces of the nano-structures. The formation processes are adjusted to achieve thicker corner portions and sidewall portions than the horizontal portions. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 20:
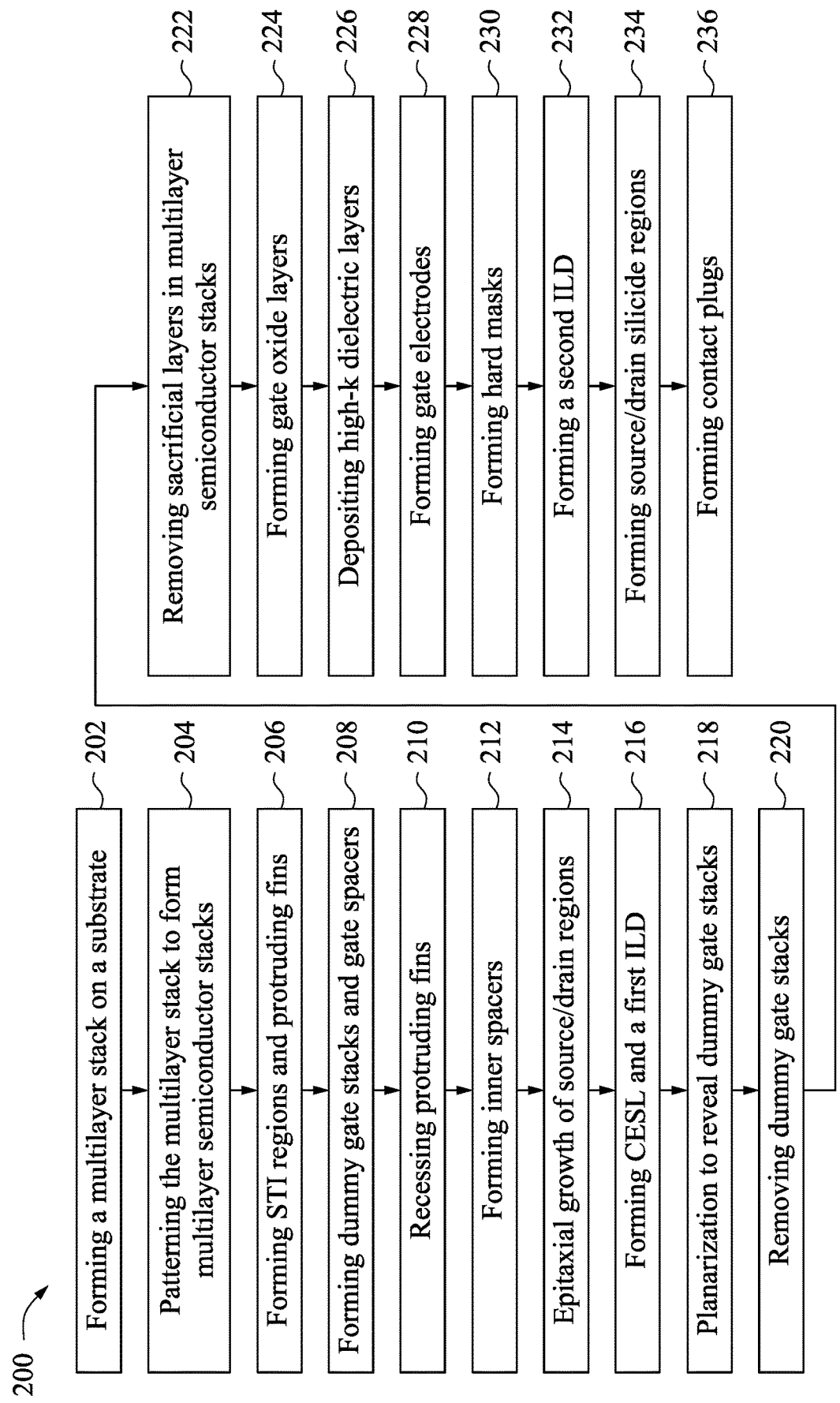
FIG. 20 illustrates a process flow for forming a nano-structure transistor in accordance with some embodiments.

FIGS. 1-4, 5A, 5B, 6A, 6B, 7A, 7B, 8A, 8B, 9A, 9B, 9C, 10A, 10B, 11A, 11B, 12A, 12B, 13A, 13B, 14A, 14B, 15A, 15B, 15C, 16A, 16B, and 16C illustrate the perspective views and cross-sectional views of intermediate stages in the formation of a nanostructure transistor in accordance with some embodiments of the present disclosure. The corresponding processes are also reflected schematically in the process flow shown in FIG. 20.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

In accordance with some embodiments, multilayer stack 22 is formed through a series of deposition processes for depositing alternating materials. The respective process is illustrated as process 202 in the process flow 200 shown in FIG. 20. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. However, the second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B in accordance with alternative embodiments. In accordance with some embodiments, first layers 22A are removed in the subsequent processes, and are alternatively referred to as sacrificial layers 22A throughout the description. In accordance with alternative embodiments, second layers 22B are removed in the subsequent processes.

In accordance with some embodiments, there are some pad oxide layer(s) and hard mask layer(s) (not shown) formed over multilayer stack 22, which layers are used for the patterning process as presented in subsequent figures. These layers are patterned, and are used for the subsequent patterning of multilayer stack 22.

Figure 2:
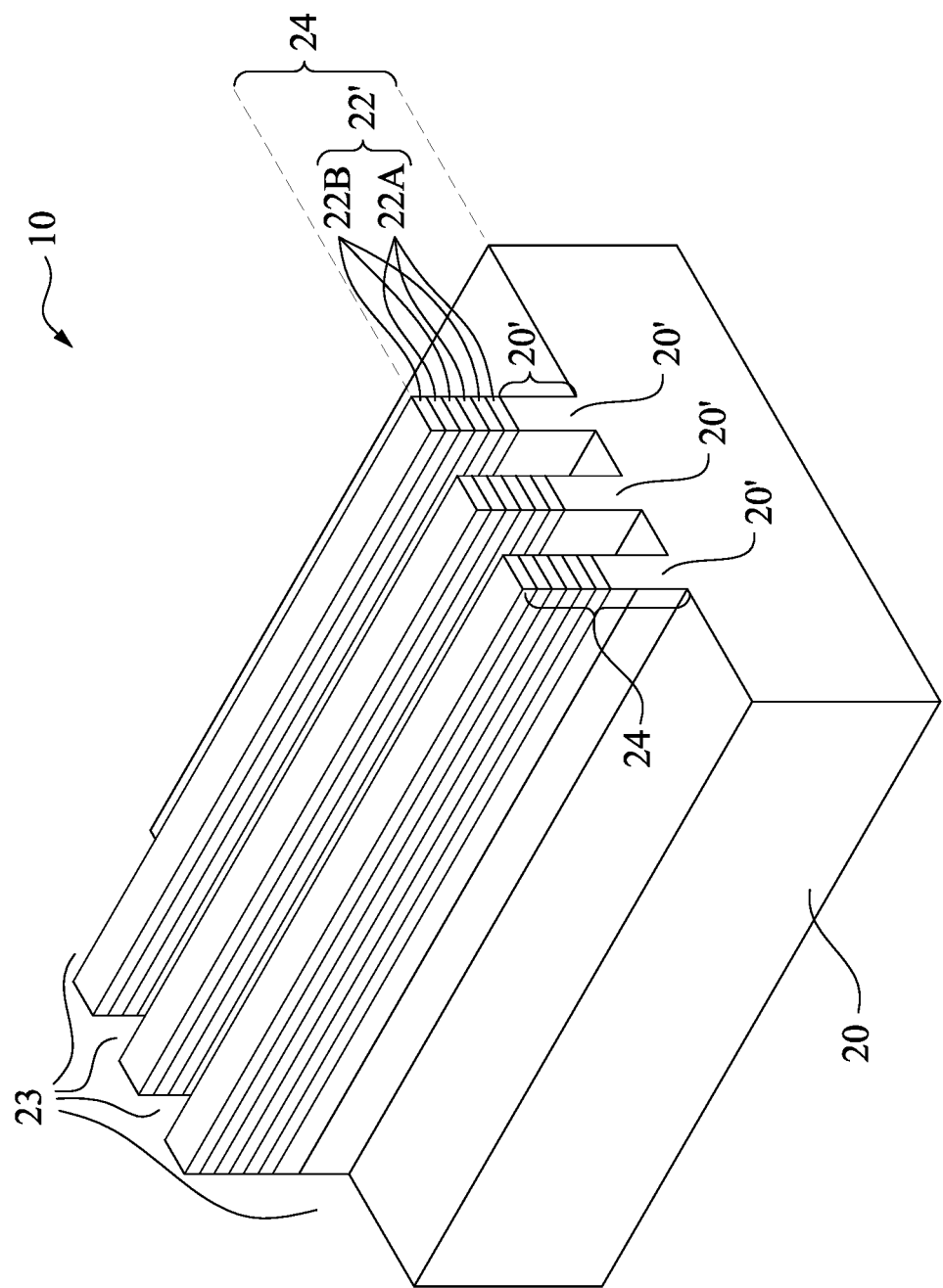

Referring to FIG. 2, multilayer stack 22 and a portion of the underlying substrate 20 are patterned in an etching process(es), so that trenches 23 are formed. The respective process is illustrated as process 204 in the process flow 200 shown in FIG. 20. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
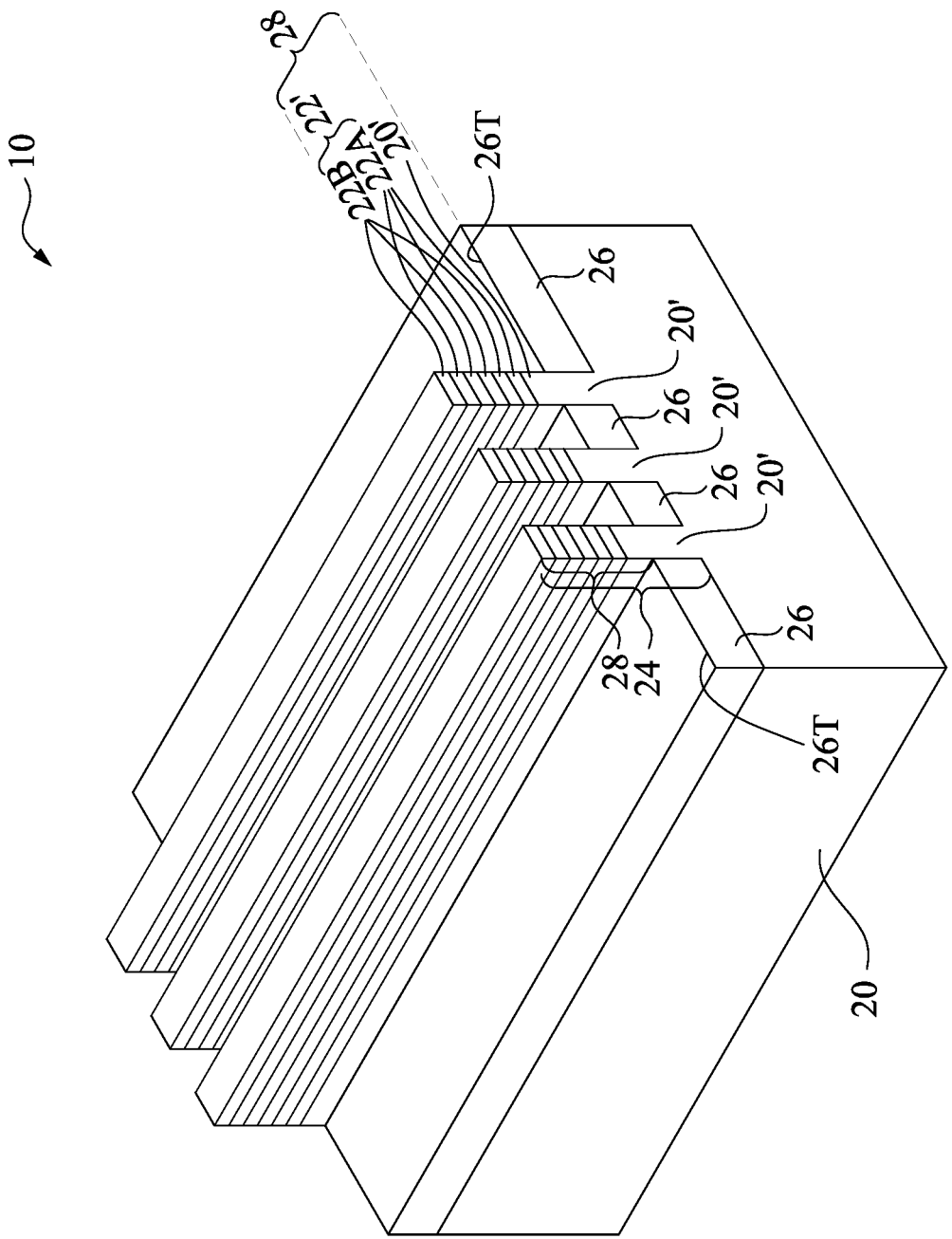

FIG. 3 illustrates the formation of isolation regions 26, which are also referred to as Shallow Trench Isolation (STI) regions throughout the description. The respective process is illustrated as process 206 in the process flow 200 shown in FIG. 20. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multilayer stacks 22' and the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
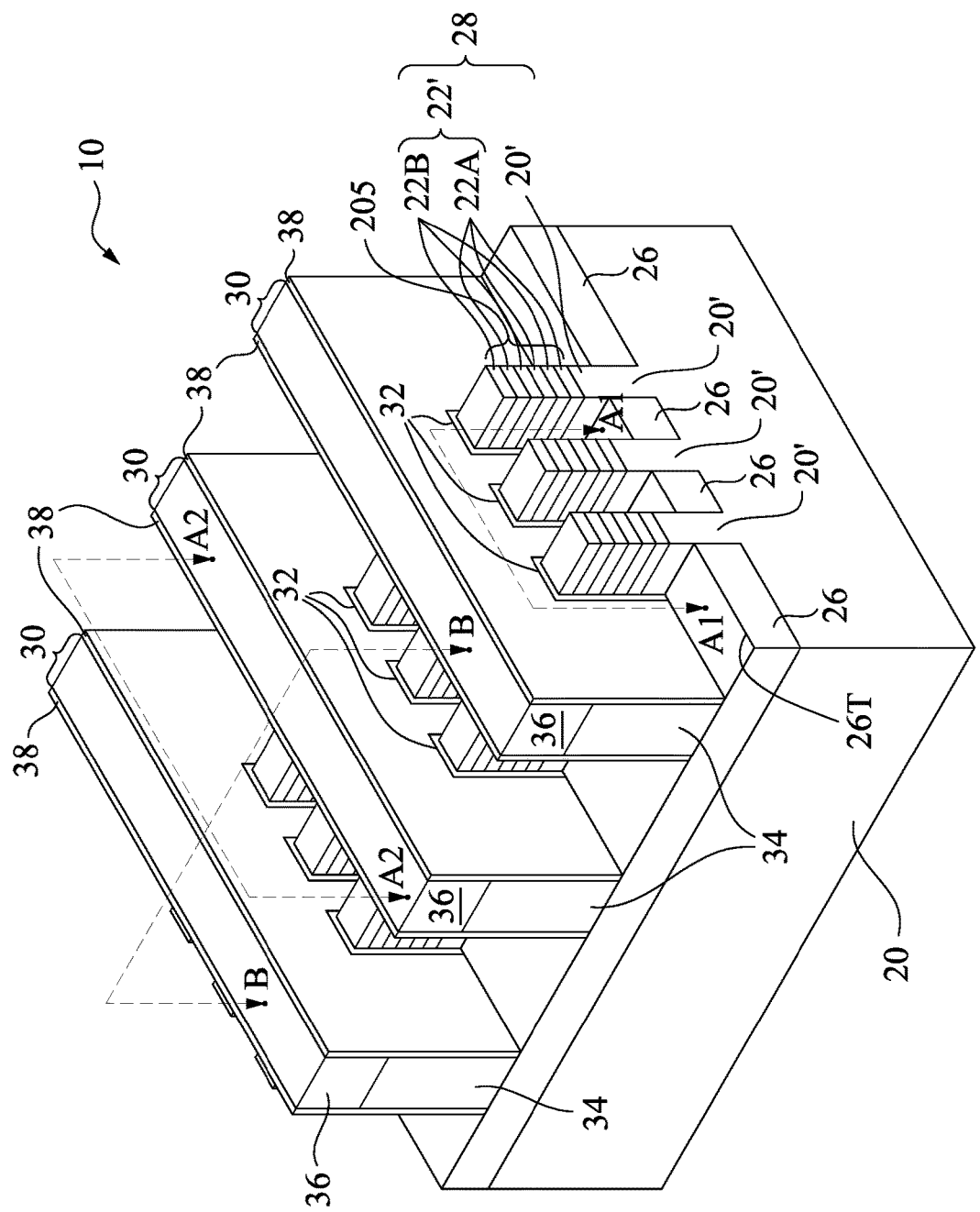

Referring to FIG. 4, dummy gate stacks 30 and gate spacers 38 are formed on the top surfaces and the sidewalls of (protruding) fins 28. The respective process is illustrated as process 208 in the process flow 200 shown in FIG. 20. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers. Dummy gate electrodes 34 may be formed, for example, using polysilicon or amorphous silicon, and other materials such as amorphous carbon may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a patterning process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide (SiO$_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 5B:
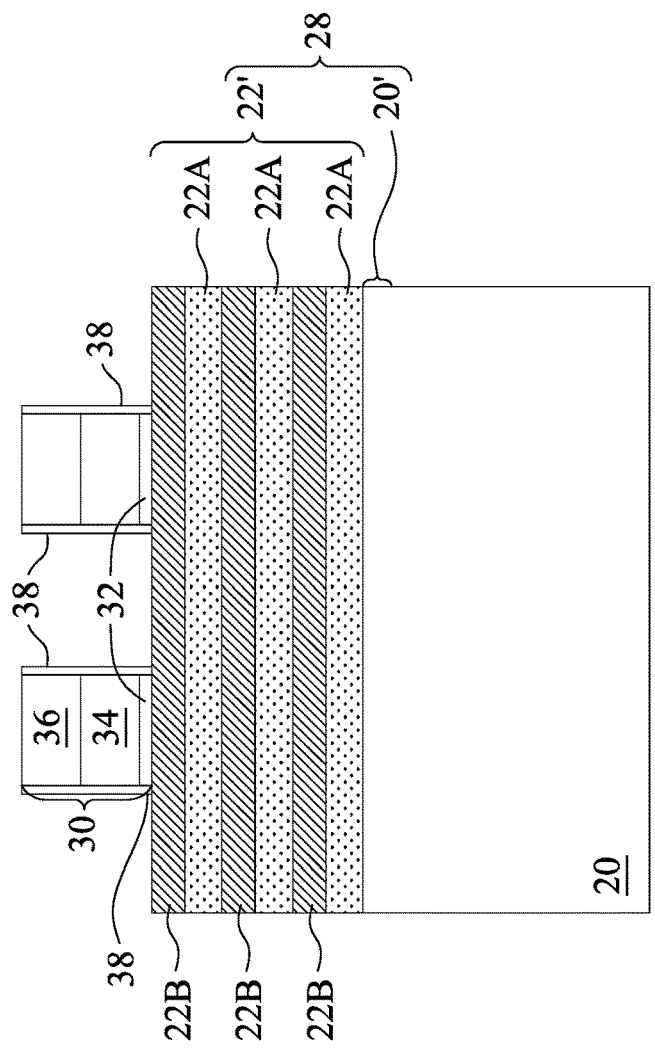
Figure 5A:
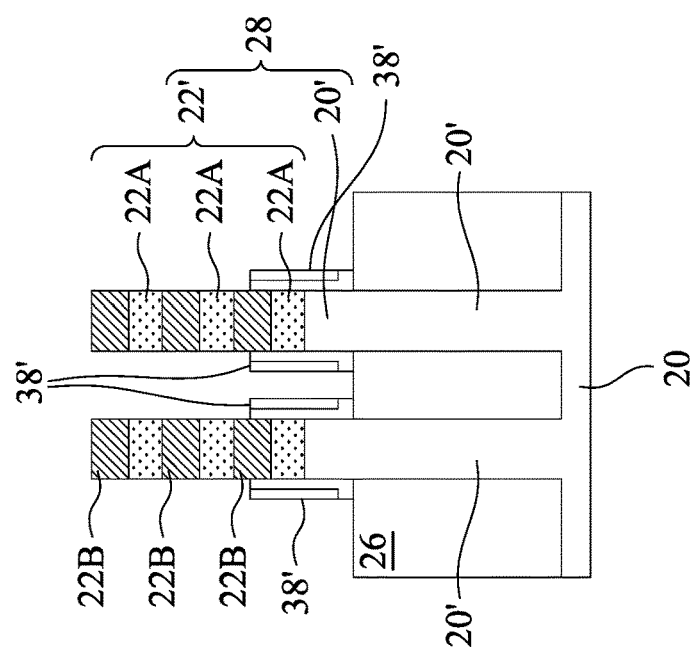

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by gate stacks 30 and gate spacers 38, and is parallel to the gate-length direction. Fin spacers 38', which are on the sidewalls of protruding fins 28, are also illustrated. FIG. 5B illustrates the reference cross-section B-B in FIG. 4, which reference cross-section is parallel to the lengthwise directions of protruding fins 28.

Figure 6B:
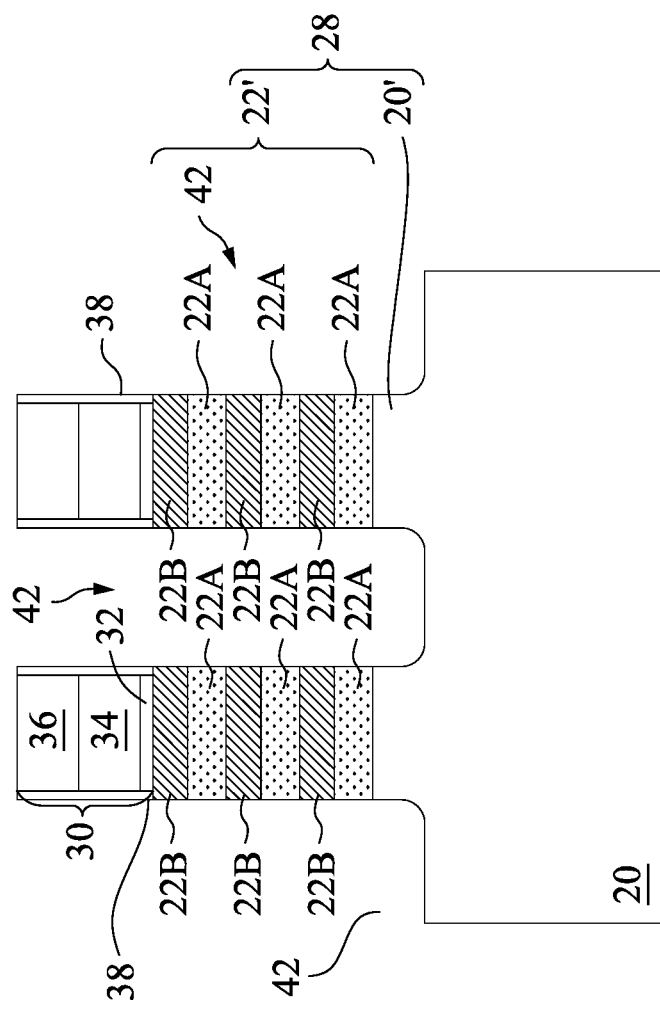
Figure 6A:
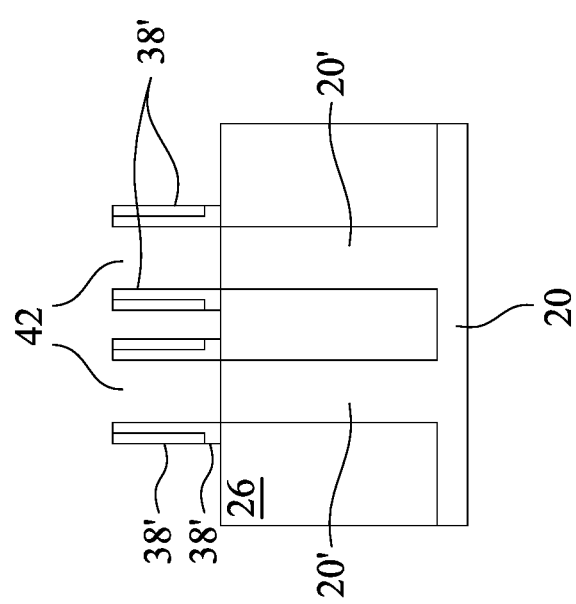

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown in FIG. 20. For example, a dry etch process may be performed using tetramethylammonium hydroxide (TMAH) or the like to etch multilayer semiconductor stacks 22' and the underlying substrate strips 20'. The bottoms of recesses 42 are at least level with, or may be lower than (as shown in FIG. 6B), the bottoms of multilayer semiconductor stacks 22'. The etching may be anisotropic, so that the sidewalls of multilayer semiconductor stacks 22' facing recesses 42 are vertical and straight, as shown in FIG. 6B.

Figure 7B:
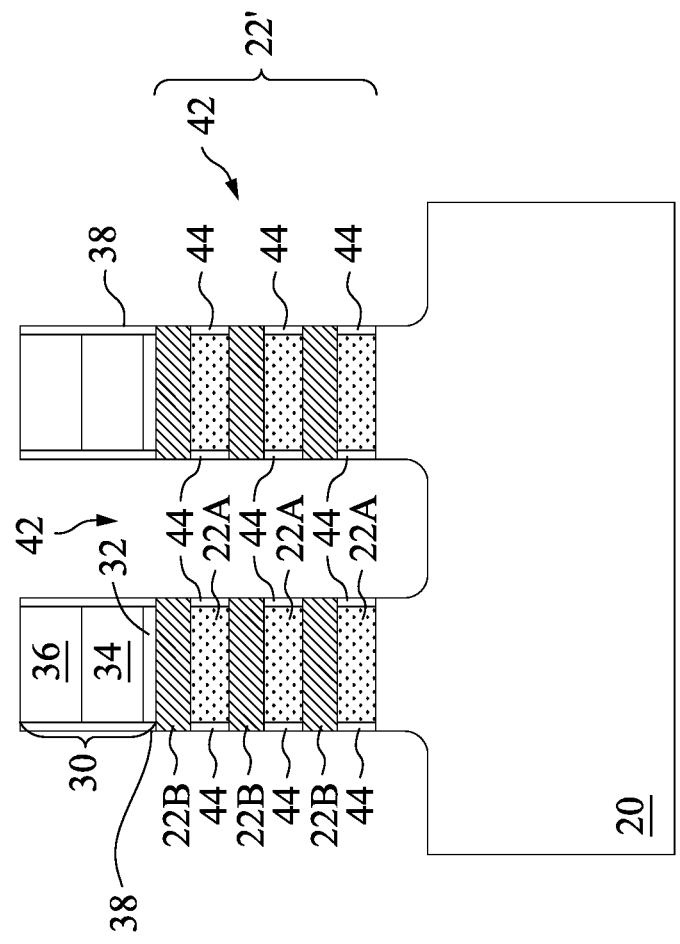
Figure 7A:
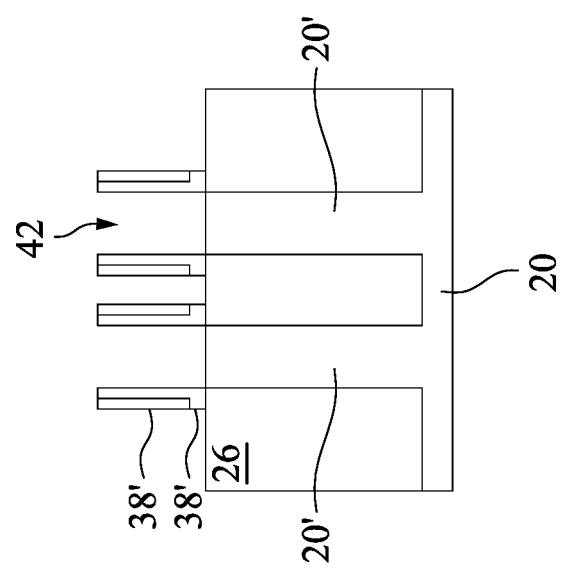

Referring to FIGS. 7A and 7B, inner spacers 44 are formed. The respective process is illustrated as process 212 in the process flow 200 shown in FIG. 20. In accordance with some embodiments, the formation of inner spacers 44 may include laterally recessing sacrificial semiconductor layers 22A, and filling a dielectric material into the corresponding recesses to form inner spacers 44. The lateral recessing of sacrificial semiconductor layers 22A may be achieved through a wet etching process using an etchant that is more selective to the material of sacrificial semiconductor layers 22A (for example, silicon germanium (SiGe)) than the material of the nanostructures 22B (for example, silicon (Si)) and substrate 20 (for example, silicon (Si)). For example, in an embodiment in which sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, a spin-on process, or the like, and may be performed using any suitable process temperatures (for example, between about 400° C. and about 600° C.) and a suitable process time (for example, between about 100 seconds and about 1,000 seconds). In accordance with alternative embodiments, the lateral recessing of sacrificial semiconductor layers 22A is performed through an isotropic dry etching process or a combination of a dry etching process and a wet etching process.

Once sacrificial semiconductor layers 22A are recessed laterally to form the corresponding recesses, a spacer material is deposited to fill the corresponding recesses. The spacer material may be different from the material of gate spacers 38, and may be a dielectric material comprising silicon such as silicon nitride (SiN), silicon oxide (SiO$_2$), silicon oxynitride (SiON), silicon oxycarbonitride (SiOCN), silicon carbo-nitride (SiCN), silicon oxycarbide (SiOC), or the like, while any other suitable material such as low-k materials with a k-value less than about 3.5, or combination thereof may also be utilized. The spacer material may be deposited using a conformal deposition process such as CVD, ALD, or the like, to a thickness in the range between about 2 nm and about 10 nm, for example. A dry etching and/or a wet etching process is then performed to remove the portions of the spacer material on the sidewalls of nanostructures 22B, so that the sidewalls of nanostructures 22B are exposed. The remaining portions of the spacer material are inner spacers 44. Inner spacers 44 are used to isolate the subsequently formed gate structures from the subsequently formed source/drain regions, and to prevent the damage of the source/drain regions in subsequent etching processes, such as the etching of dummy gate stacks 30.

Figure 8B:
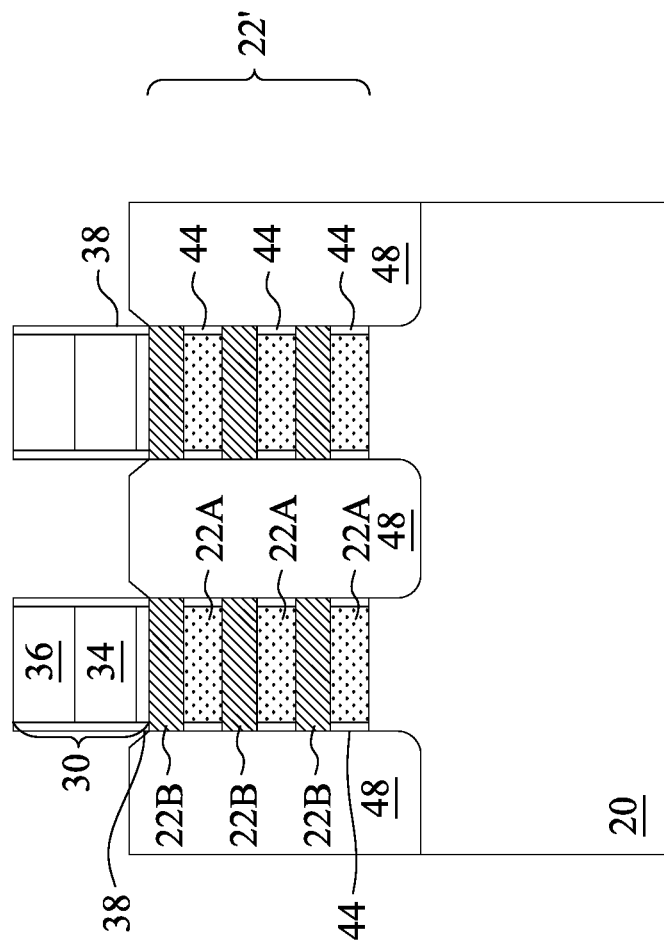
Figure 8A:
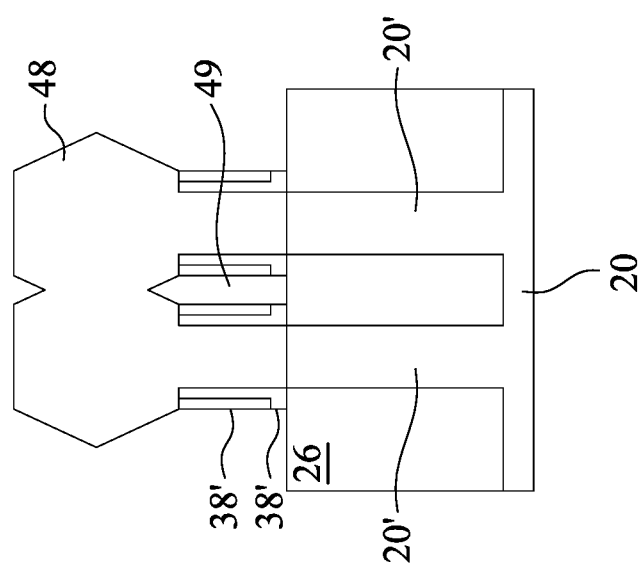

Referring to FIGS. 8A and 8B, epitaxial source/drain regions 48 are formed in recesses 42. The respective process is illustrated as process 214 in the process flow 200 shown in FIG. 20. In accordance with some embodiments, the source/drain regions 48 may exert stress on the nanostructures 22B, which are used as the channels of the corresponding GAA transistors, thereby improving performance. Depending on whether the resulting transistor is a p-type transistor or an n-type transistor, a p-type or an n-type impurity may be in-situ doped with the proceeding of the epitaxy. For example, when the resulting transistor is a p-type Transistor, silicon germanium boron (SiGeB), silicon boron (SiB), or the like may be grown. Conversely, when the resulting transistor is an n-type Transistor, silicon phosphorous (SiP), silicon carbon phosphorous (SiCP), or the like may be grown. After recesses 42 are filled with epitaxy regions 48, the further epitaxial growth of epitaxy regions 48 causes epitaxy regions 48 to expand horizontally, and facets may be formed. The further growth of epitaxy regions 48 may also cause neighboring epitaxy regions 48 to merge with each other. Voids (air gaps) 49 may be generated.

After the epitaxy process, epitaxy regions 48 may be further implanted with a p-type or an n-type impurity to form source and drain regions, which are also denoted using reference numeral 48. In accordance with alternative embodiments of the present disclosure, the implantation process is skipped when epitaxy regions 48 are in-situ doped with the p-type or n-type impurity during the epitaxy.

The subsequent figure numbers in FIGS. 9A, 9B, and 9C through FIGS. 16A, 16B, and 16C may have the corresponding numbers followed by letter A, B, or C, wherein the figure with the figure number having the letter A indicates that the corresponding figure shows a reference cross-section same as the reference cross-section A2-A2 in FIG. 4, the figure with the figure number having the letter B indicates that the corresponding figure shows a reference cross-section same as the reference cross-section B-B in FIG. 4, and the figure with the figure number having the letter C indicates that the corresponding figure shows a reference cross-section same as the reference cross-section A1-A1 in FIG. 4.

Figure 9B:
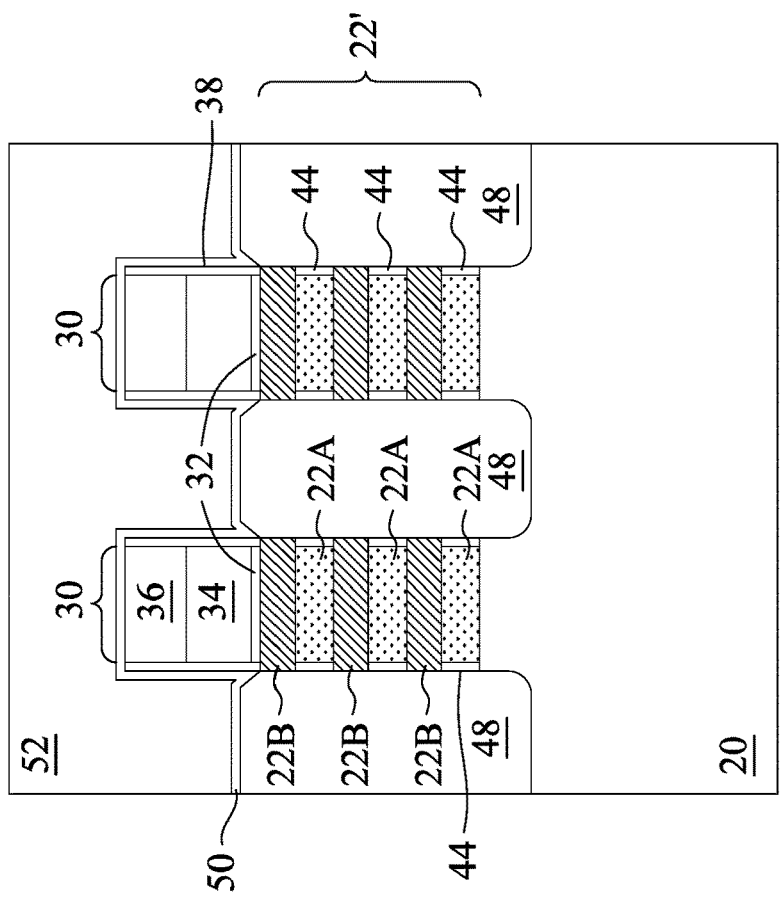
Figure 9A:
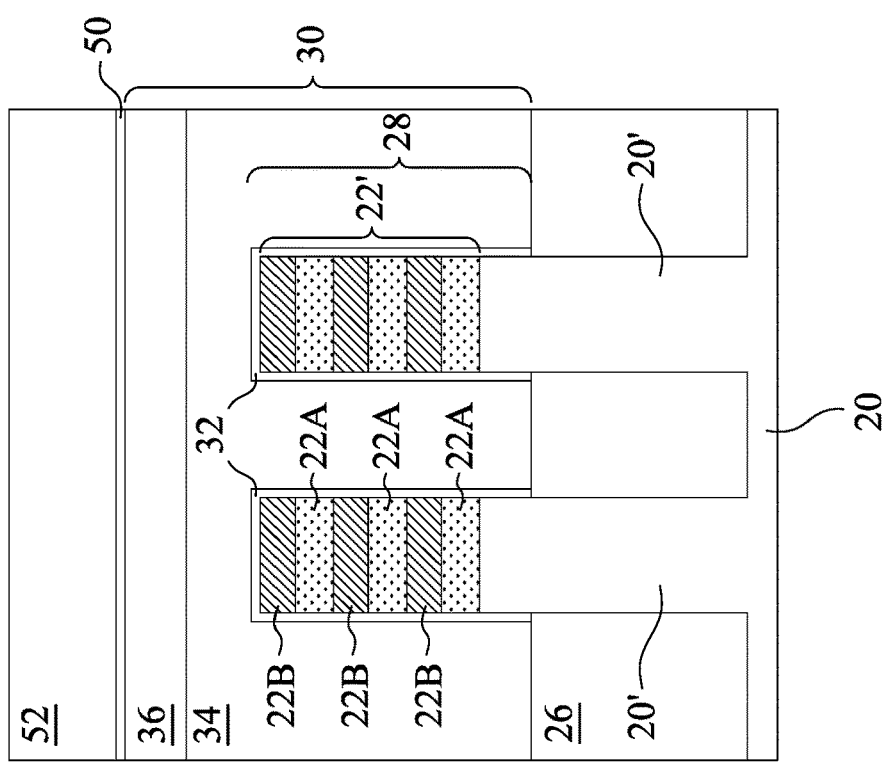
Figure 9C:
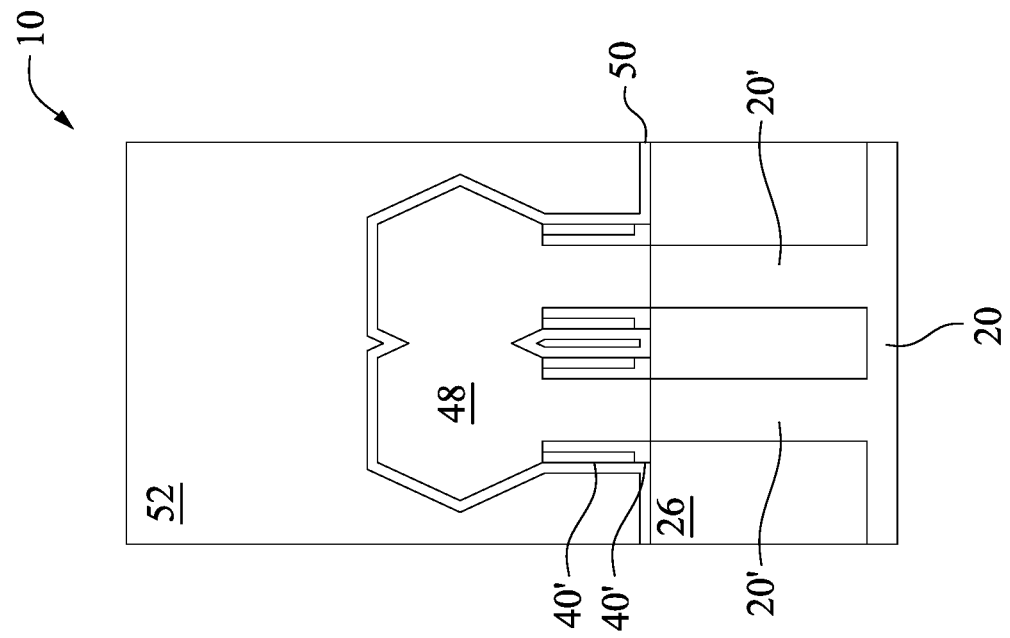

FIGS. 9A, 9B, and 9C illustrate the cross-sectional views of the structure after the formation of Contact Etch Stop Layer (CESL) 50 and Inter-Layer Dielectric (ILD) 52. The respective process is illustrated as process 216 in the process flow 200 shown in FIG. 20. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), Undoped Silicate Glass (USG), or the like.

Figure 10B:
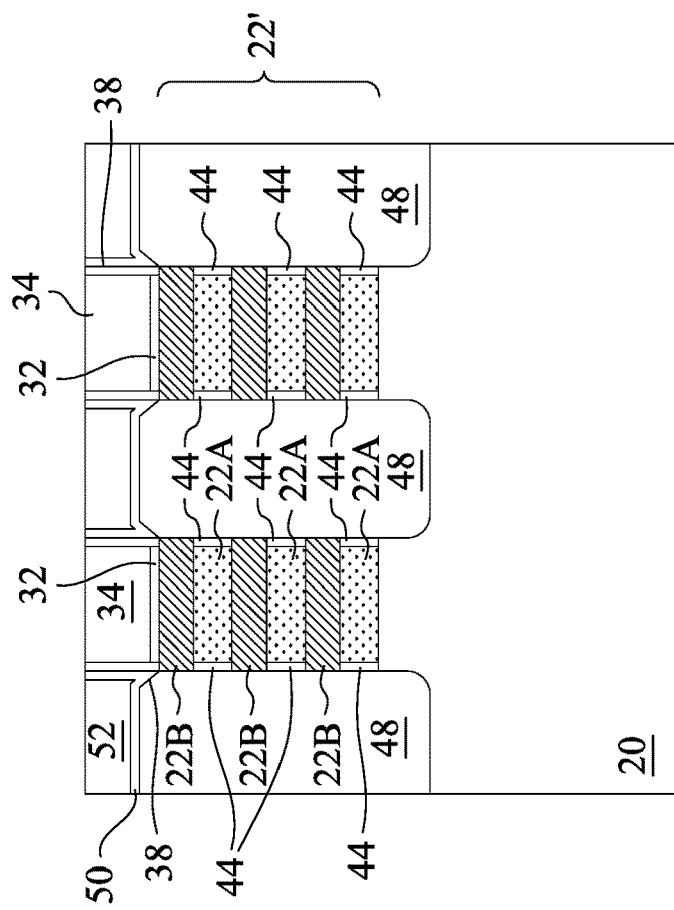
Figure 10A:
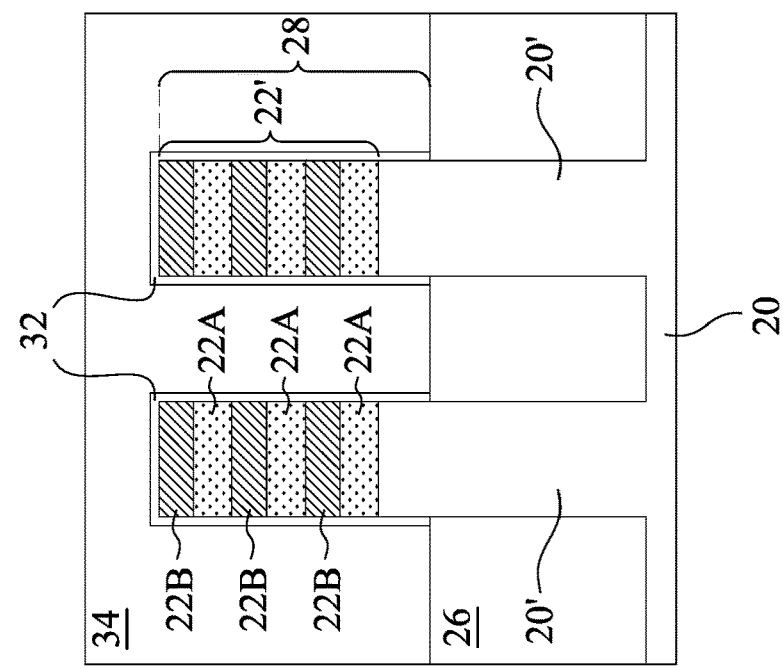

FIGS. 10A and 10B through FIGS. 14A and 14B illustrate the process for forming replacement gate stacks. In FIGS. 10A and 10B, a planarization process such as a CMP process or a mechanical grinding process is performed to level the top surface of ILD 52. The respective process is illustrated as process 218 in the process flow 200 shown in FIG. 20. In accordance with some embodiments, the planarization process may remove hard masks 36 to reveal dummy gate electrodes 34. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level within process variations.

Figure 11B:
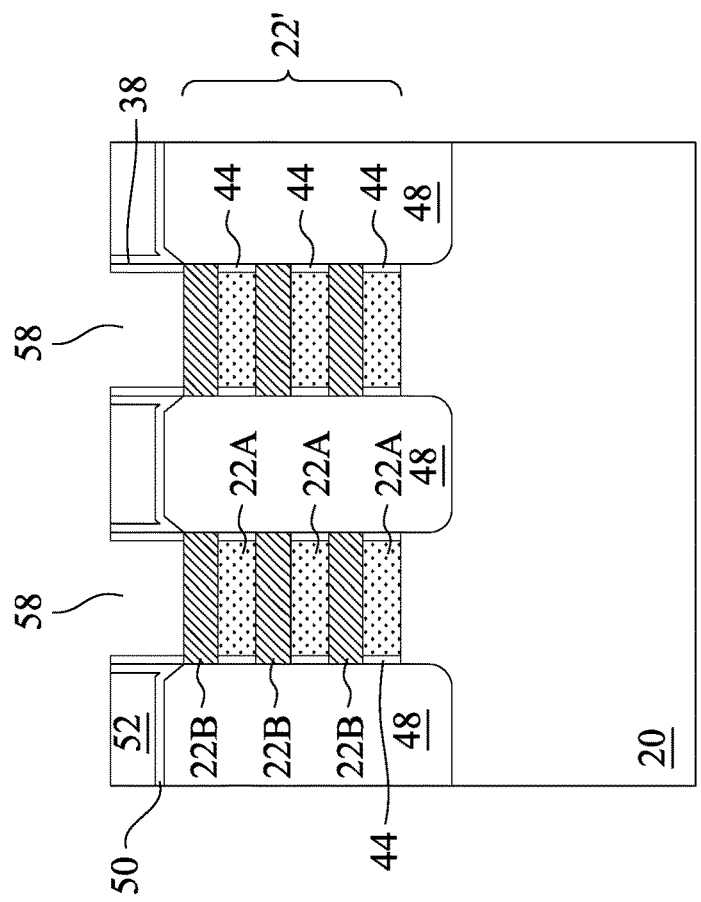
Figure 11A:
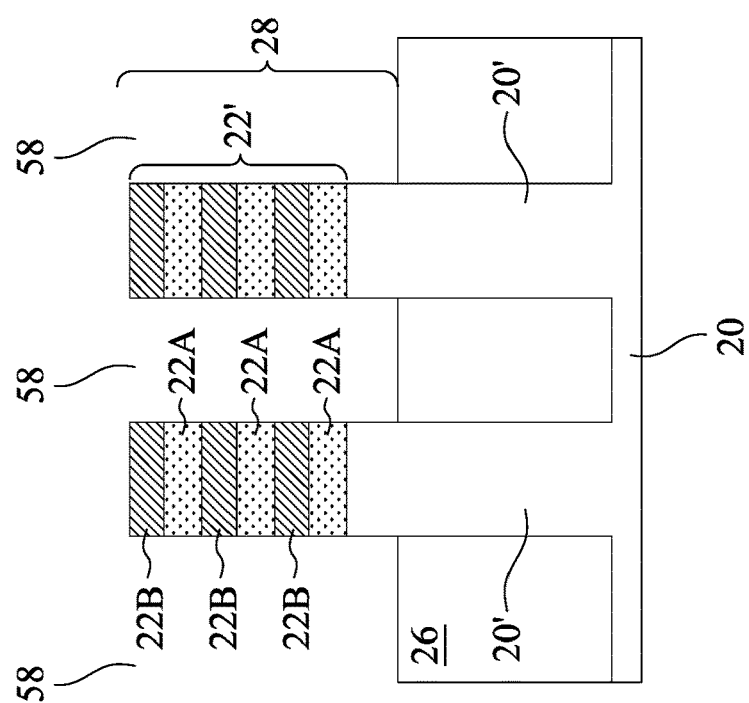

Next, dummy gate electrodes 34 (and hard masks 36, if remaining) are removed in one or more etching processes, so that recesses 58 are formed, as shown in FIGS. 11A and 11B. The respective process is illustrated as process 220 in the process flow 200 shown in FIG. 20. The portions of the dummy gate dielectrics 32 in recesses 58 are also removed. In accordance with some embodiments, dummy gate electrodes 34 and dummy gate dielectrics 32 are removed through an anisotropic dry etch process. For example, the etching process may be performed using reaction gas(es) that selectively etch dummy gate electrodes 34 at a faster rate than ILD 52. Each recess 58 exposes and/or overlies portions of multilayer stacks 22', which include the future channel regions in subsequently completed nano-FETs. The portions of the multilayer stacks 22', which act as the channel regions, are between neighboring pairs of the epitaxial source/drain regions 48.

Figure 12B:
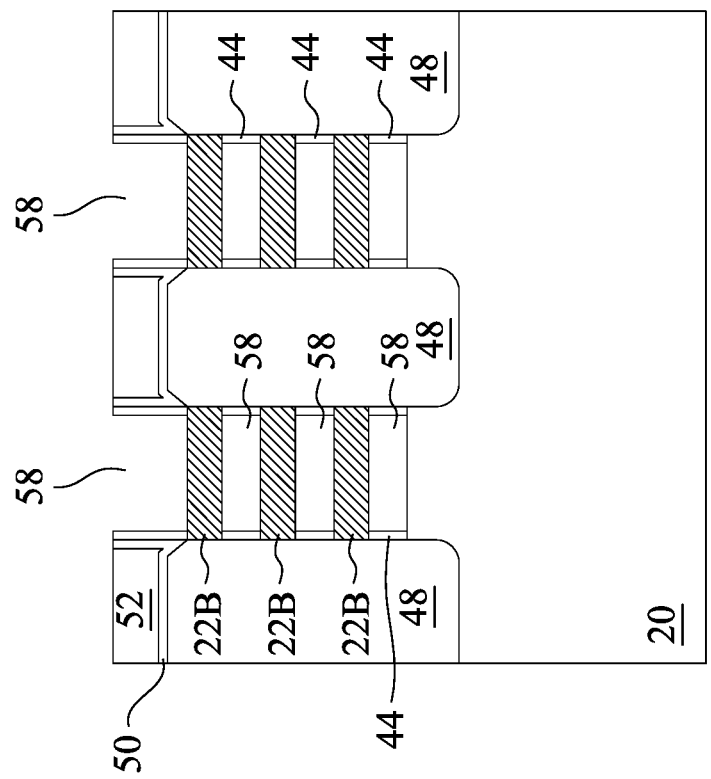
Figure 12A:
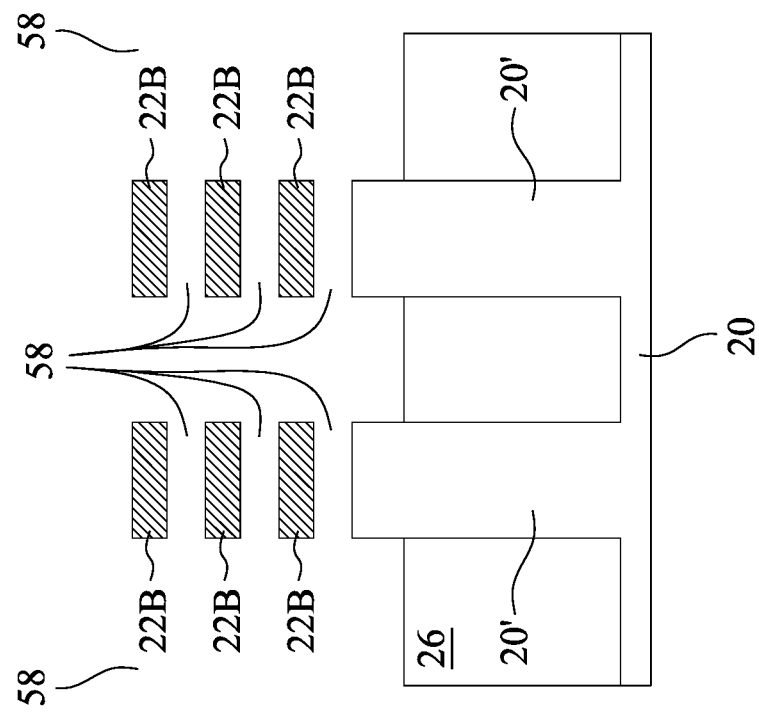

Sacrificial layers 22A are then removed to extend recesses 58 between nanostructures 22B, and the resulting structure is shown in FIGS. 12A and 12B. The respective process is illustrated as process 222 in the process flow 200 shown in FIG. 20. Sacrificial layers 22A may be removed by performing an isotropic etching process such as a wet etching process using etchants which are selective to the materials of sacrificial layers 22A, while nanostructures 22B, substrate 20, STI regions 26 remain relatively un-etched as compared to sacrificial layers 22A. In accordance with some embodiments in which sacrificial layers 22A include, for example, SiGe, and nanostructures 22B include, for example, Si or SiC, tetra methyl ammonium hydroxide (TMAH), ammonium hydroxide (NH$_4$OH), or the like may be used to remove sacrificial layers 22A.

Figure 13B:
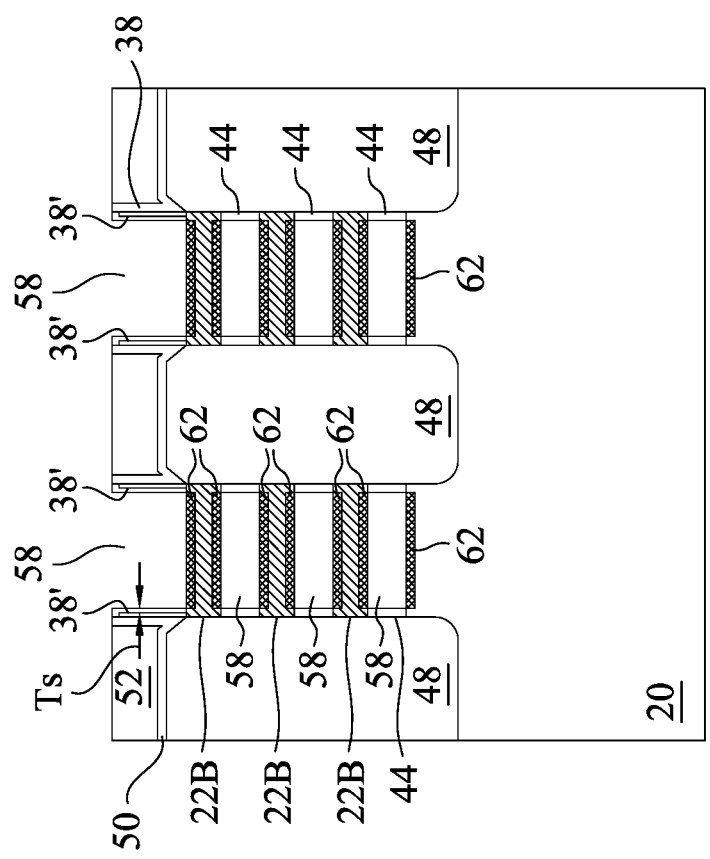
Figure 13A:
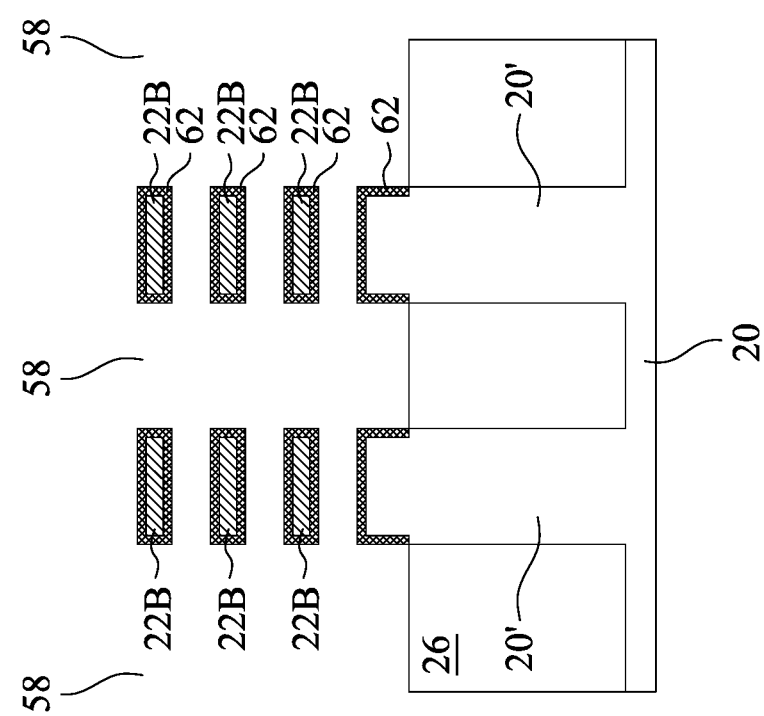
Figure 17:
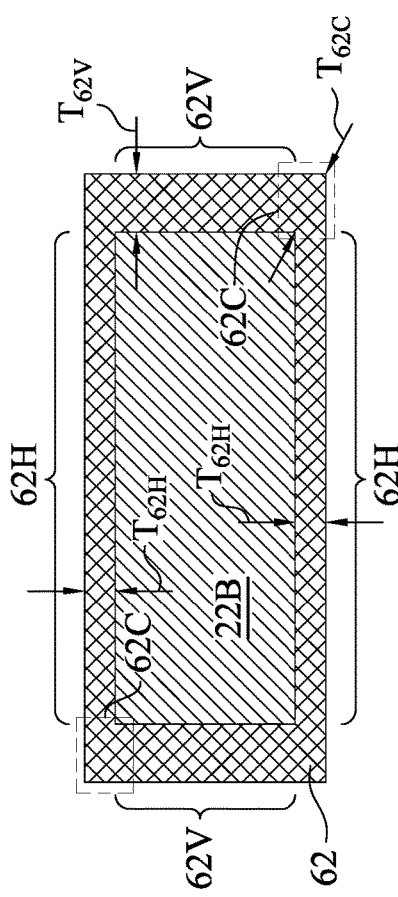
FIGS. 17 through 19 illustrate cross-sectional views of an oxide layer on a semiconductor strip in accordance with some embodiments.
Figure 18:
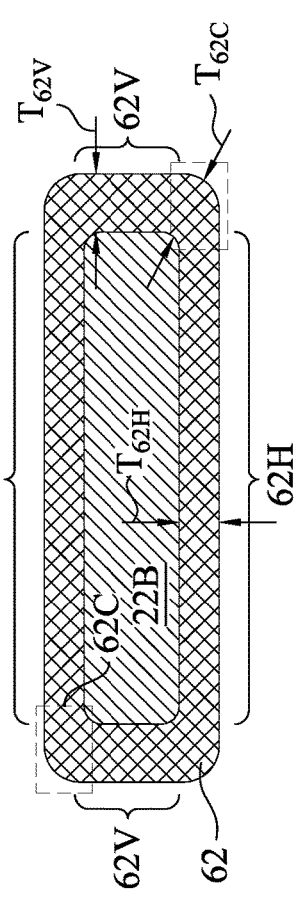
Figure 19:
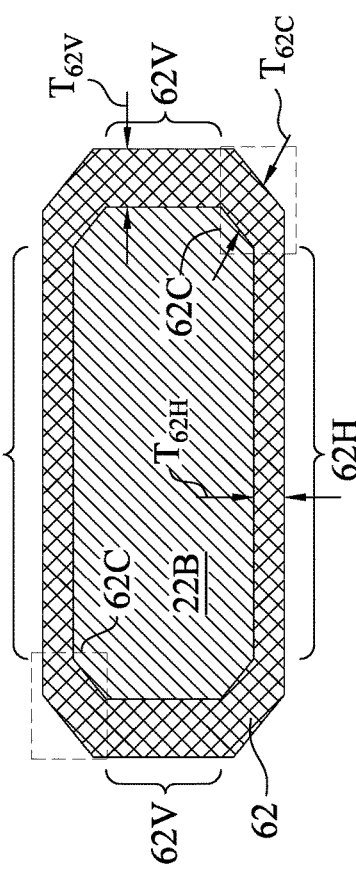

Referring to FIGS. 13A and 13B, gate oxide layers 62 are formed. The respective process is illustrated as process 224 in the process flow 200 shown in FIG. 20. In accordance with some embodiments, the formation processes and the corresponding process conditions are adjusted, so that gate oxide layers 62 have non-uniform thicknesses. FIGS. 17, 18, and 19 illustrate the amplified views of nanostructures 22B and gate oxide layers 62 in accordance with some embodiments. A nanostructure 22B may have a top surface, a bottom surface, and sidewall surfaces. Gate oxide layer 62 includes horizontal portions 62H on the top surface and bottom surface of nanostructure 22B, with horizontal portions 62H having thickness $T_{62H}$. Gate oxide layers 62 also includes vertical portions 62V on the opposing sidewalls of nanostructure 22B, with vertical portions 62V having thickness $T_{62V}$. The formation processes of gate oxide layers 62 are adjusted (as discussed in details below) to result in the increase in thickness $T_{62V}$ of vertical portions 62V to be greater than thickness $T_{62H}$ of horizontal portions 62H. This is different from the gate dielectric in conventional nano-FETs, in which the vertical portions and horizontal portions of gate dielectric have equal thicknesses. In accordance with some embodiments, ratio $T_{62V}/T_{62H}$ is greater than 1.0, and may be in the range between 1.0 (not including 1.0) and about 1.4, and may be in the range between about 1.1 and about 1.4, or in the range between about 1.25 and about 1.4. For example, thickness $T_{62H}$ may be in the range between about 0.3 nm and about 3.0 nm, and thickness $T_{62V}$ may be in the range between about 0.33 nm and about 4.2 nm.

Furthermore, gate oxide layers 62 include corner portions 62C at the corners of nanostructure 22B, with the corner portions 62C having thickness $T_{62C}$. In accordance with some embodiments, ratio $T_{62C}/T_{62H}$ is greater than about 1.4, and may be greater than about 1.5, and may also be in the range between about 1.5 and bout 1.7. For example, corner thickness $T_{62C}$ may be in the range between about 0.52 nm and about 5.2 nm. It is appreciated that the corner regions are where electrical field concentrates, and are prone to dielectric breakdown. Since electrical field is proportional to voltage and inversely proportional to the thickness of the dielectric on which the voltage is applied, by increasing the corner thickness $T_{62C}$ (which increase is partially contributed by the increase of vertical thickness $T_{62V}$), the electrical field is reduced, and the possibility of dielectric breakdown is accordingly reduced. On the other hand, the thickness $T_{62H}$ of horizontal portions 62H is kept not increased so that it does not occupy the space of the subsequently formed replacement gate stacks.

In accordance with some embodiments, gate oxide layers 62 are formed through a Plasma Enhanced Atomic Layer Deposition (PEALD) process. The gate oxide formation may be performed at a temperature in the range between about 160° C. and about 520° C. The process may include pulsing a first process gas, purging the first process gas (for example, using nitrogen (N$_2$)), pulsing a second process gas, purging the second process gas (for example, using nitrogen (N$_2$)). The first process gas may include a silicon-containing process gas such as Bis(diethylamino)silane (BDEAS), SiH$_4$, Si$_2$H$_6$, Si$_3$H$_8$, or the like, or combinations thereof. The second process gas may include an oxygen-containing gas such as oxygen (O$_2$ and/or O$_3$) and/or H$_2$O, and other gases such as nitrogen (N$_2$), hydrogen (H$_2$), argon, helium, krypton, xenon, and/or the like, or combinations thereof. The pressure of the process gas may be in the range between about 500 mTorr and about 5 Torr. The duration of each of the pulsing and purging cycle may last between about 0.1 seconds and about 10 seconds. During the pulsing stage, the power for generating the plasma may be in the range between about 10 watts and about 1,000 watts. Also, a bias power, which may be in the range between about 0 watts and about 300 watts may be applied. The resulting PEALD process is thus non-isotropic including both of the anisotropic effect (which causes the vertical thickness $T_{62V}$ to be increased over the horizontal thickness $T_{62H}$) and the isotropic effect.

In accordance with alternative embodiments, gate oxide layers 62 are formed through a remote plasma process. For example, plasma may be generated in a process chamber other than the formation chamber in which the wafer 10 is located, and is conducted into the formation chamber. The process gas may include an oxygen-containing gas such as oxygen ($O_2$ and/or $O_3$) and/or $H_2O$, and other process gases such as nitrogen ($N_2$), hydrogen ($H_2$), argon, helium, and/or the like, or combinations thereof. The gate oxide formation may be performed at a temperature in the range between about 50° C. and about 850° C. The pressure of the process gas may be in the range between about 10 mTorr and about 500 Torr. The duration of the oxidation process may last between about 3 seconds and about 30 minutes. The plasma power may be in the range between about 300 watts and about 6,000 watts.

In accordance with yet alternative embodiments, gate oxide layers 62 are formed through a thermal oxidation process, which may be (or may be referred to as) a rapid thermal processing process, a rapid thermal annealing process, a rapid thermal oxidation process, or the like. The process gas may include an oxygen-containing gas such as oxygen ($O_2$ and/or $O_3$) and/or $H_2O$, and other process gases such as nitrogen ($N_2$), hydrogen ($H_2$), argon, helium, krypton, xenon, and/or the like, or combinations thereof. The gate oxide formation may be performed at a temperature in the range between about 550° C. and about 850° C. The pressure of the process gas may be in the range between about 30 mTorr and about 760 Torr. The duration of the oxidation process may last between about 1 second and about 180 seconds.

Referring back to FIGS. 13A and 13B, through the addition of the oxygen-containing gas in the process gases, the surface portions of the exposed semiconductor material such as nanostructures 22B are oxidized. Furthermore, the addition of the silicon-containing process gas may also result in the addition of the oxide through adding silicon, which is oxidized when deposited.

In the formation of gate oxide layers 62, process conditions are adjusted to achieve greater corner thickness $T_{62C}$ and greater vertical thickness $T_{62V}$ without increasing horizontal thickness $T_{62H}$. The temperatures, the pressure, the plasma power, and the bias power are adjusted to be in certain ranges to achieve the desirable thicknesses and desirable thickness ratios. For example, the temperature and the plasma power may not be too low. Otherwise, the corner thickness $T_{62C}$ and vertical thickness $T_{62V}$ may not be increased (as compared to horizontal thickness $T_{62H}$) to desirable values. On the other hand, the temperatures, the plasma power and the bias power may not be too high. Otherwise, too much of nanostructures 22B may be consumed, leaving inadequate amount of channels. Furthermore, the pressure and the flow rates of process gases also affect the distribution of the process gases in recesses 58, and affect which parts of nanostructures are exposed to more process gas, and affect the ratios of the thicknesses. For example, a higher pressure may result in the increase in the ratios $T_{62C}/T_{62H}$ and $T_{62V}/T_{62H}$. On the other hand, if the pressure is too high, the quality of the oxide layer 62 may degrade. The desirable ratios $T_{62C}/T_{62H}$ and $T_{62V}/T_{62H}$ are achieved through the adjustments of multiple process conditions including, and not limited to, temperatures, plasma power, bias power, pressure, and flow rate, etc.

In accordance with some embodiments, a plurality of experiments may be performed on a plurality of sample wafers, with the sample nanostructures and sample oxide layers formed thereon. The process conditions for forming the sample oxide layers on the plurality of sample wafers are different from each other, and the resulting sample oxide layers are measured. The optimal process conditions (which may include the aforementioned process conditions) and their combinations are determined, and are used in the formation of the nanostructure transistors, in which the desirable ratios $T_{62C}/T_{62H}$ and $T_{62V}/T_{62H}$ are achieved.

During the formation of gate oxide layers 62, the surface portions 38' of gate spacers 38 exposed to the process gases are also oxidized (which means these portions have a higher oxygen concentration than the inner un-oxidized portions of gate spacers 38). Furthermore, the surface portions of inner spacers 44 exposed to the process gases are also oxidized (which means these portions have a higher oxygen concentration than the inner un-oxidized portions of inner spacers 44). In accordance with some embodiments, the surface oxidized portions 38' of gate spacers 38 and the surface oxidized portions of inner spacers 44 have thicknesses Ts in the range between about 0.1 nm and about 3.6 nm. The ratio of Ts/$T_{62C}$ (with $T_{62C}$ shown in FIGS. 17 through 19) may be in the range between about 0.0033 and about 12.

Figure 14B:
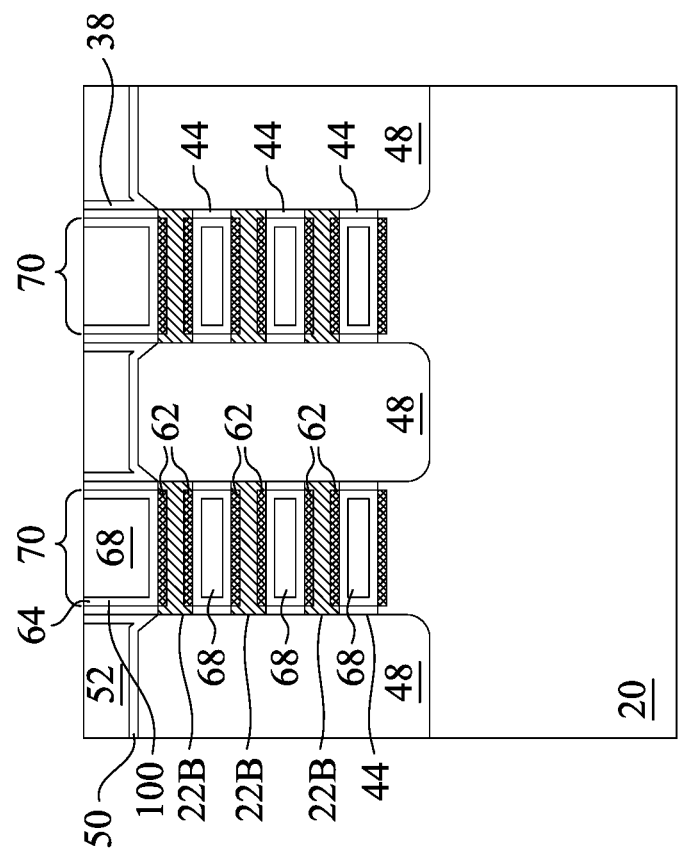
Figure 14A:
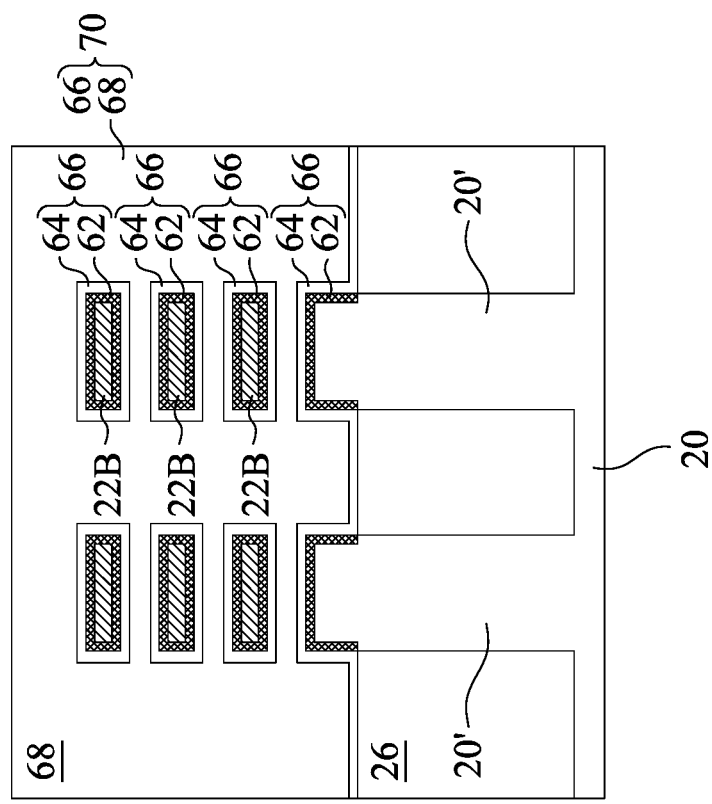

Referring to FIGS. 14A and 14B, high-k dielectric layer 64 and gate electrodes 68 are formed as parts of replacement gate stacks. The respective process is illustrated as processes 226 and 228 in the process flow 200 shown in FIG. 20. Oxide layers 62 and high-k dielectric layers 64 are collectively referred to as gate dielectrics 66. The high-k dielectric layers 64 are deposited conformally in recesses 58, with different portions of dielectric layers 64 having a uniform thickness. High-k dielectric layer 64 may be formed on the top surfaces and the sidewalls of the exposed substrate strips 20', and on the top surfaces, the sidewalls, and the bottom surfaces of oxide layers 62. The high-k dielectric layer 64 may also be deposited on the top surfaces of the ILD 52, CESL 50, gate spacers 38, and STI regions 26. In accordance with some embodiments, high-k dielectric layers 64 are formed through a conformal deposition method such as ALD, CVD, or the like, so that the horizontal portions, the vertical portions, and the corner portions have the same thickness.

In accordance with some embodiments, high-k dielectric layers 64 comprise one or more dielectric layers, such as one or more metal oxide layers. For example, in accordance with some embodiments, high-k dielectric layers 64 may be formed of or comprise a high-k dielectric material, which may have a k value greater than about 7.0, and may include a metal oxide or a silicate of hafnium, aluminum, zirconium, lanthanum, manganese, barium, titanium, lead, and combinations thereof.

Gate electrodes 68 are deposited over high-k dielectric layer 64, and fill the remaining portions of recesses 58. Gate electrodes 68 may include a metal-containing material such as TiN, TaN, TiAl, TiAlC, cobalt, ruthenium, aluminum, tungsten, combinations thereof, and/or multilayers thereof. For example, although single-layer gate electrodes 68 are illustrated in FIGS. 14A and 14B, gate electrodes 68 may comprise any number of layers, any number of work function layers, and a filling material. Gate electrodes 68 may be deposited to fill the spaces between adjacent ones of nanostructures 22B, and fill the spaces between the bottom ones of nanostructures 22B and the underlying substrate strips 20'.

After the filling of recesses 58, a planarization process such as a CMP process or a mechanical grinding process is performed to remove the excess portions of high-k dielectric layer 64 and the material of gate electrodes 68, which excess portions are over the top surface of ILD 52. Gate electrodes 68 and gate dielectrics 66 (including oxide layers 62 and high-k dielectric layers 64) are collectively referred to as gate stacks 70 of the resulting nano-FETs.

Figures 15A, 15B:
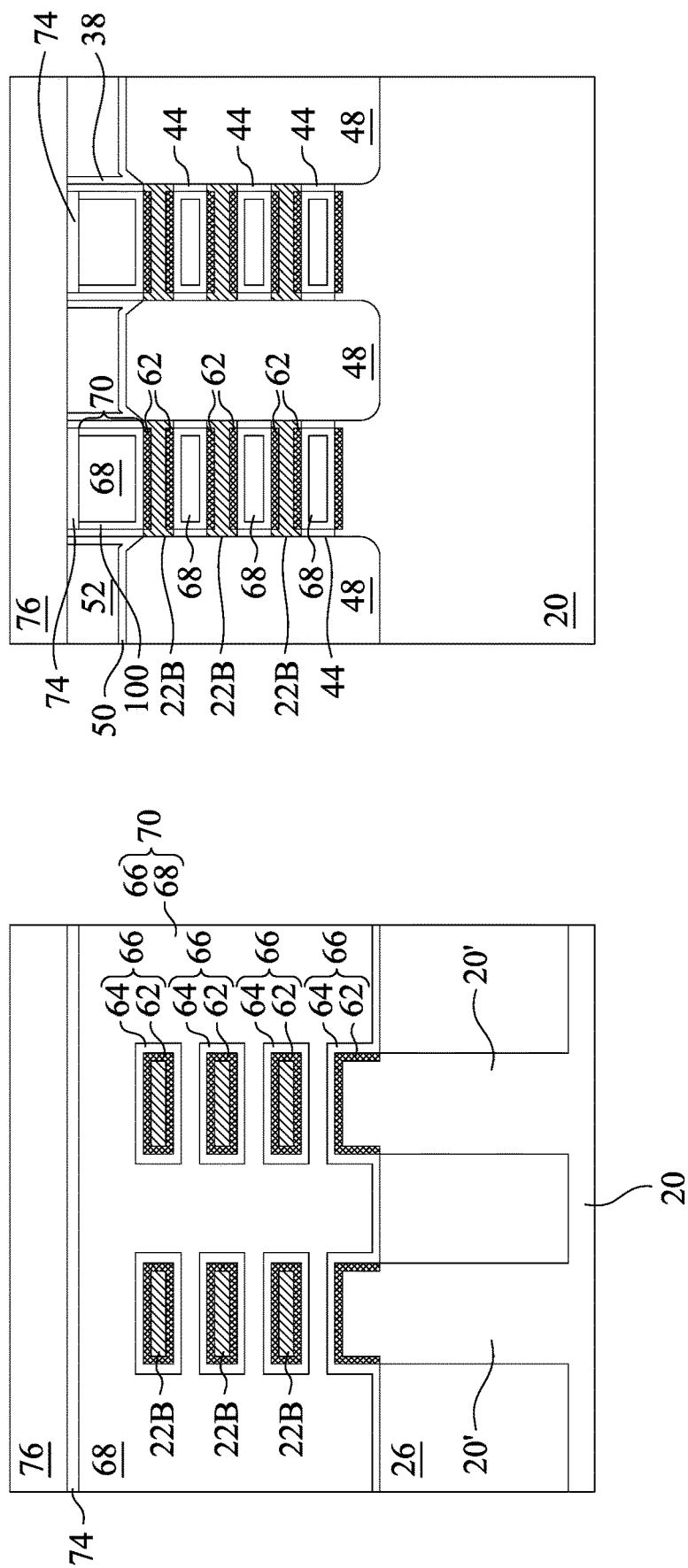
Figure 15C:
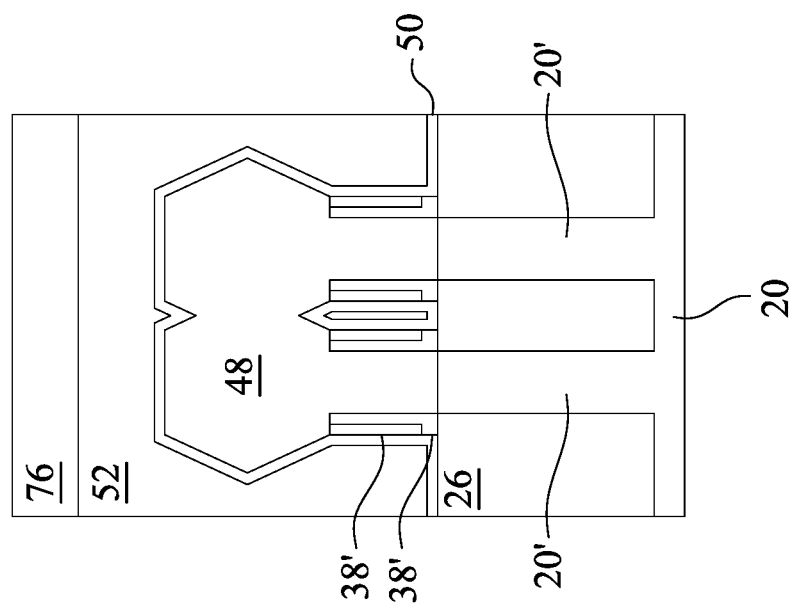

In the processes shown in FIGS. 15A, 15B, and 15C, gate stacks 70 (including high-k dielectric layer 64 and the corresponding overlying gate electrodes 68) are recessed, so that recesses are formed directly over gate stacks 70 and between opposing portions of gate spacers 38. A gate mask 74 comprising one or more layers of dielectric material, such as silicon nitride, silicon oxynitride, or the like, is filled in each of the recesses, followed by a planarization process to remove excess portions of the dielectric material extending over ILD 52. The respective process is illustrated as process 230 in the process flow 200 shown in FIG. 20. Subsequently formed gate contacts (such as the gate contact plugs 80, discussed below with respect to FIGS. 16A and 16B) penetrate through the gate mask 74 to contact the top surface of the recessed gate electrodes 68.

As further illustrated by FIGS. 15A, 15B, and 15C, ILD 76 is deposited over ILD 52 and over gate masks 74. The respective process is illustrated as process 232 in the process flow 200 shown in FIG. 20. An etch stop layer (not shown), may be, or may not be deposited before the formation of ILD 76. In accordance with some embodiments, ILD 76 is formed through FCVD, CVD, PECVD, or the like. ILD 76 is formed of a dielectric material, which may be selected from silicon oxide, PSG, BSG, BPSG, USG, or the like.

Figure 16B:
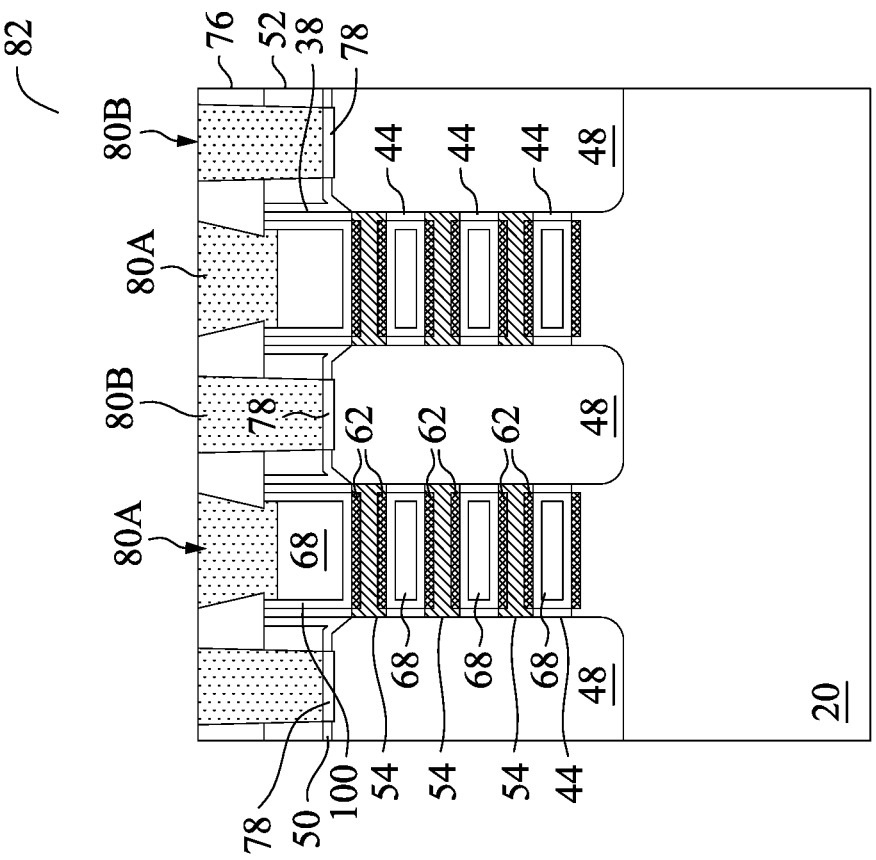
Figure 16A:
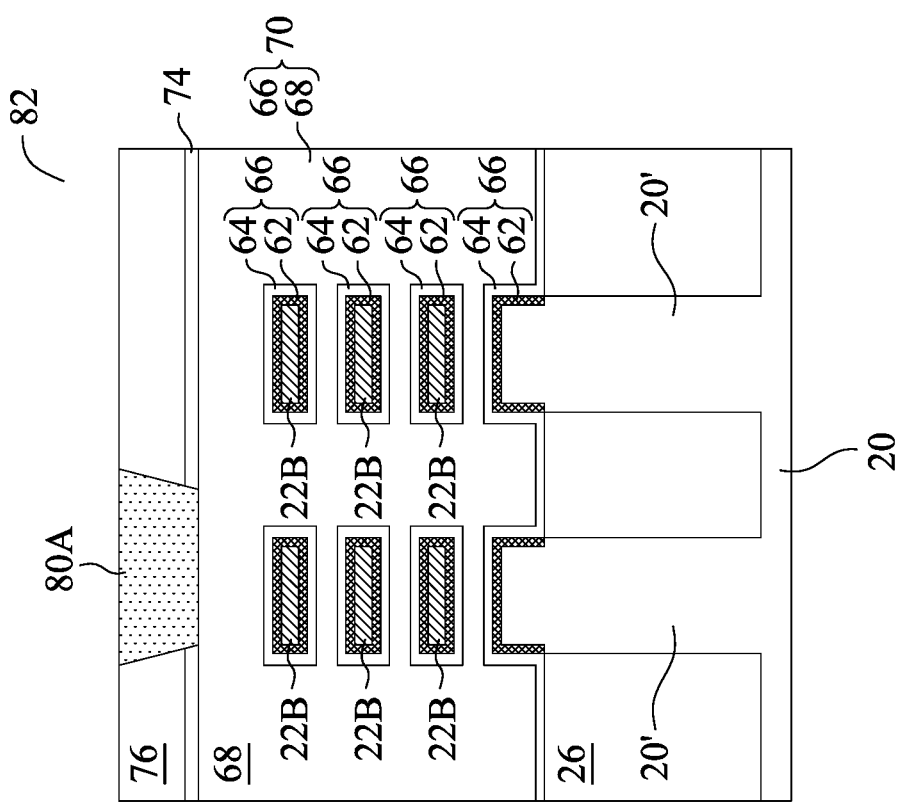
Figure 16C:
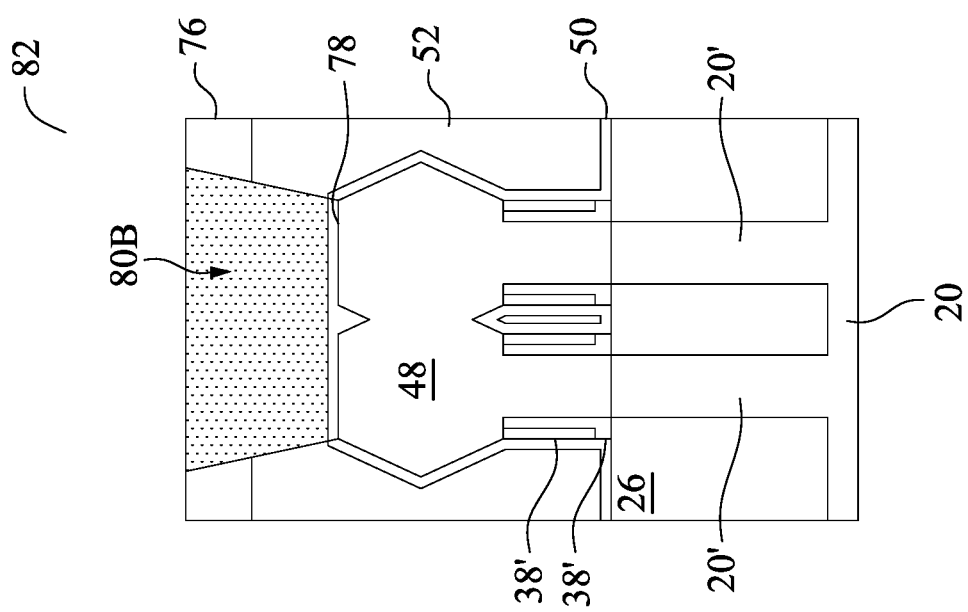

In FIGS. 16A, 16B, and 16C, ILD 76, ILD 52, CESL 50, and gate masks 74 are etched to form recesses (occupied by contact plugs 80A and 80B) exposing surfaces of the epitaxial source/drain regions 48 and/or gate stacks 70. The recesses may be formed through etching using an anisotropic etching process, such as RIE, NBE, or the like. In accordance with some embodiments, the recesses may be formed by etching-through ILD 76 and ILD 52 using a first etching process, etching-through gate masks 74 using a second etching process, and etching-through CESL 50 possibly using a third etching process. Although FIG. 16B illustrates that contact plugs 80A and 80B are in a same cross-section, in various embodiments, contact plugs 80A and 80B may be formed in different cross-sections, thereby reducing the risk of shorting with each other.

After the recesses are formed, silicide regions 78 (FIGS. 16B and 16C) are formed over the epitaxial source/drain regions 48. The respective process is illustrated as process 234 in the process flow 200 shown in FIG. 20. In accordance with some embodiments, silicide regions 78 are formed by first depositing a metal layer (not shown) capable of reacting with the semiconductor materials of the underlying epitaxial source/drain regions 48 (for example, silicon, silicon germanium, germanium) to form silicide and/or germanide regions, then performing a thermal anneal process to form silicide regions 78. The metal may include nickel, cobalt, titanium, tantalum, platinum, tungsten, or the like. The un-reacted portions of the deposited metal are then removed, for example, by an etching process.

Contact plugs 80B are then formed over silicide regions 78. Also, contact plugs 80A (may also be referred to as gate contact plugs) are also formed in the recesses, and are over and contacting gate electrodes 68. The respective processes are illustrated as process 236 in the process flow 200 shown in FIG. 20. Contact plugs 80A and 80B may each comprise one or more layers, such as a barrier layer, a diffusion layer, and a fill material. For example, in accordance with some embodiments, contact plugs 80A and 80B each includes a barrier layer and a conductive material, and are electrically coupled to the underlying conductive feature (for example, gate stacks 70 and/or silicide region 78 in the illustrated embodiment). The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP process, may be performed to remove excess material from a surface of ILD 76. Nano-FET 82 is thus formed.

FIGS. 17, 18, and 19 illustrate nanostructures 22B and the gate oxide layers 62 formed thereon. FIG. 17 illustrates a cross-section, in which nanostructure 22B has a rectangular shape. The outer contour shape of gate oxide layer 62 is also a rectangle. FIG. 18 illustrates an embodiment in which the corners of nanostructure 22B are rounded, which may be caused due to the removal of sacrificial layers 22A (FIGS. 12A and 12B). Accordingly, the outer surfaces and inner surfaces of gate oxide layer 62 may also have rounded corner portions. FIG. 19 illustrates that facets are formed on nanostructure 22B. For example, the top surface and the bottom surface of nanostructure 22B may be on (100) surface planes, the sidewalls of nanostructure 22B may be on (110) surface planes, and the corner surfaces of nanostructure 22B may be on (111) surface planes. Accordingly, gate oxide layers 62 have shapes following the shapes of the surfaces of nanostructure 22B. The thicknesses $T_{62H}$ of horizontal portions 62H, thicknesses $T_{62V}$ of vertical portions 62V, the thicknesses $T_{62C}$ of corner portions 62C, and their ratios have been discussed referring in preceding paragraphs, and are not repeated herein.

The embodiments of the present disclosure have some advantageous features. By forming corners of gate oxides with increased thicknesses, the electrical field at the corners of the gate oxides, which are prone to dielectric breakdown, is reduced. The possibility of the dielectric breakdown is thus reduced, and possibly eliminated.

In accordance with some embodiments of the present disclosure, a method comprises epitaxially growing a plurality of semiconductor layers and a plurality of sacrificial layers alternatingly; patterning the plurality of semiconductor layers and the plurality of sacrificial layers to form a stack; removing a first portion and a second portion of the stack to form a first trench and a second trench, respectively; forming a first source/drain region and a second source/drain region in the first trench and the second trench, respectively, with a portion of the stack in between; removing the plurality of sacrificial layers from the portion of the stack; oxidizing the plurality of semiconductor layers in the portion of the stack to form gate oxides on the plurality of semiconductor layers, wherein the gate oxides comprise an oxide layer formed on a semiconductor layer in the plurality of semiconductor layers, and wherein the oxide layer comprises a horizontal portion and a vertical portion, and the vertical portion is thicker than the horizontal portion; and forming a gate electrode wrapping around the semiconductor layer and the oxide layer. In an embodiment, the oxidizing is performed using a plasma enhanced atomic layer deposition process, with an oxygen-containing process gas being used. In an embodiment, the plasma enhanced atomic layer deposition process comprises pulsing and purging a silicon-containing precursor; and pulsing and purging the oxygen-containing process gas. In an embodiment, the oxidizing is performed using remote plasma oxidation process. In an embodiment, the oxidizing is performed using a thermal oxidation process. In an embodiment, the oxide layer further comprises a corner portion having a first thickness, and the horizontal portion has a second thickness, and wherein a ratio of the first thickness to the second thickness is greater than about 1.5. In an embodiment, the vertical portion of the oxide layer has a first thickness, and the horizontal portion of the oxide layer has a second thickness, and a ratio of the first thickness to the second thickness is greater than about 1.1. In an embodiment, the ratio of the first thickness to the second thickness is in a range between about 1.1 and about 1.4.

In accordance with some embodiments of the present disclosure, a device comprises a semiconductor nanostructure; an oxide layer comprising horizontal portions on a top surface and a bottom surface of the semiconductor nanostructure, wherein the horizontal portions have a first thickness; vertical portions on sidewalls of the semiconductor nanostructure, wherein the vertical portions have a second thickness; and corner portions on corners of the semiconductor nanostructure, wherein the corner portions have a third thickness, and wherein both of the second thickness and the third thickness are greater than the first thickness; a high-k dielectric layer surrounding the oxide layer; and a gate electrode surrounding the high-k dielectric layer. In an embodiment, a ratio of the second thickness to the first thickness is greater than about 1.1. In an embodiment, the ratio of the second thickness to the first thickness is in a range between about 1.1 and about 1.4. In an embodiment, a ratio of the third thickness to the first thickness is greater than about 1.5. In an embodiment, the ratio of the third thickness to the first thickness is in a range between about 1.5 and about 1.7. In an embodiment, the semiconductor nanostructure comprises a silicon nano-strip, and the oxide layer comprises silicon oxide. In an embodiment, the device further comprises a gate spacer contacting a part of the high-k dielectric layer, wherein the gate spacer comprises a first portion and a second portion, with the first portion between and contacting the second portion and the high-k dielectric layer, and wherein the first portion comprises all elements in the second portion, and the first portion has a higher oxygen concentration than the second portion.

In accordance with some embodiments of the present disclosure, a device comprises a nano-FET, which comprises a plurality of semiconductor strips, wherein higher ones of the plurality of semiconductor strips overlap corresponding lower ones of the plurality of semiconductor strips, and the plurality of semiconductor strips are vertically spaced apart from each other by spaces; a plurality of oxide layers, each wrapping around one of the plurality of semiconductor strips, wherein one of the plurality of oxide layers comprises a first portion having a first thickness; and a second portion having a second thickness, wherein a ratio of the second thickness to the first thickness is greater than about 1.5. In an embodiment, the first portion and the second portion are formed of a same material, and comprise same elements with same percentages of the same elements. In an embodiment, the first portion is a horizontal portion on a top surface or a bottom surface of a corresponding one of the plurality of semiconductor strips, and the second portion is a corner portion at a corner of the corresponding one of the plurality of semiconductor strips. In an embodiment, the device further comprises a high-k dielectric layer wrapping around each of the plurality of oxide layers; and a gate electrode wrapping around the high-k dielectric layer. In an embodiment, the device further comprises a gate spacer contacting a sidewall of the high-k dielectric layer, wherein a first part of the gate spacer contacting the high-k dielectric layer is oxidized more than a second part of the gate spacer, with the second part being spaced apart from the high-k dielectric layer by the first part.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a plurality of semiconductor strips, wherein higher ones of the plurality of semiconductor strips overlap corresponding lower ones of the plurality of semiconductor strips, and the plurality of semiconductor strips are vertically spaced apart from each other by spaces; and
   a gate stack comprising:
      a plurality of oxide layers, each wrapping around one of the plurality of semiconductor strips, wherein one of the plurality of oxide layers comprises:
         a first portion having a first thickness, wherein the first portion is a horizontal portion on a top surface of a corresponding one of the plurality of semiconductor strips, and wherein the first thickness is measured in a direction perpendicular to the top surface; and
         a second portion having a second thickness greater than the first thickness, wherein the second thickness is measured in a diagonal direction of the one of the plurality of semiconductor strips, wherein the second portion is a corner portion at a corner of the corresponding one of the plurality of semiconductor strips, and the corner portion comprises an inner surface contacting the one of the plurality of semiconductor strips, and an outer surface opposite to, and parallel to, the inner surface, wherein the inner surface forms an obtuse angle with the top surface.

2. The device of claim 1, wherein the diagonal direction is aligned to a straight line extending from the corner to a center of the one of the plurality of semiconductor strips.

3. The device of claim 1, wherein the one of the plurality of oxide layers further comprises:
   a third portion having a third thickness greater than the first thickness, wherein the third portion is a vertical portion on a sidewall surface of a corresponding one of the plurality of semiconductor strips, and wherein the third thickness is measured in a direction parallel to the top surface.

4. The device of claim 3, wherein a ratio of the third thickness to the first thickness is in a range between about 1.25 and about 1.4.

5. The device of claim 1, wherein the plurality of oxide layers comprise an oxide of a semiconductor material of the plurality of semiconductor strips.

6. The device of claim 1, wherein a ratio of the second thickness to the first thickness is in a range between about 1.5 and about 1.7.

7. The device of claim 1, wherein the gate stack further comprises a high-k dielectric layer encircling each of the plurality of oxide layers.

8. The device of claim 7, wherein the gate stack further comprises a gate electrode comprising a plurality of portions, and wherein the high-k dielectric layers on the plurality of oxide layers are spaced apart from each other by the portions of the gate electrode.

9. A device comprising:
a semiconductor nanostructure;
an oxide layer comprising:
horizontal portions on a top surface and a bottom surface of the semiconductor nanostructure, wherein the horizontal portions have a first thickness;
vertical portions on sidewalls of the semiconductor nanostructure, wherein the vertical portions have a second thickness; and
corner portions on corners of the semiconductor nanostructure, wherein the corner portions have a third thickness, and wherein both of the second thickness and the third thickness are greater than the first thickness;
a high-k dielectric layer surrounding the oxide layer; and
a gate electrode surrounding the high-k dielectric layer.

10. The device of claim 9, wherein a ratio of the second thickness to the first thickness is greater than about 1.1.

11. The device of claim 10, wherein the ratio of the second thickness to the first thickness is in a range between about 1.1 and about 1.4.

12. The device of claim 9, wherein a ratio of the third thickness to the first thickness is greater than about 1.5.

13. The device of claim 9, wherein the first thickness is measured in a first direction perpendicular to the top surface, and the second thickness is measured in a second direction parallel to the top surface.

14. The device of claim 9, wherein the semiconductor nanostructure comprises a silicon nano-strip, and the oxide layer comprises silicon oxide.

15. The device of claim 9 further comprising a gate spacer contacting a part of the high-k dielectric layer, wherein the gate spacer comprises a first portion and a second portion, with the first portion between and contacting the second portion and the high-k dielectric layer, and wherein the first portion comprises all elements in the second portion, and the first portion has a higher oxygen concentration than the second portion.

16. A device comprising:
a nano-FET comprising:
a plurality of semiconductor strips, wherein higher ones of the plurality of semiconductor strips overlap corresponding lower ones of the plurality of semiconductor strips, and the plurality of semiconductor strips are vertically spaced apart from each other by spaces;
a plurality of oxide layers, each wrapping around one of the plurality of semiconductor strips, wherein one of the plurality of oxide layers comprises:
a first portion having a first thickness; and
a second portion having a second thickness, wherein a ratio of the second thickness to the first thickness is greater than about 1.5:
a high-k dielectric layer wrapping around each of the plurality of oxide layers;
a gate electrode wrapping around the high-k dielectric layer; and
a gate spacer contacting a sidewall of the high-k dielectric layer, wherein a first part of the gate spacer contacting the high-k dielectric layer is oxidized more than a second part of the gate spacer, with the second part being spaced apart from the high-k dielectric layer by the first part.

17. The device of claim 16, wherein the first thickness and the second thickness are measured in directions perpendicular to outer surfaces of the first portion and the second portion, respectively.

18. The device of claim 17, wherein the first portion is a horizontal portion on a top surface or a bottom surface of a corresponding one of the plurality of semiconductor strips, and the first thickness is measured in a direction perpendicular to the top surface, and the second portion is a corner portion at a corner of the corresponding one of the plurality of semiconductor strips, and the second thickness is measured in a direction that is neither parallel to nor perpendicular to the top surface.

19. The device of claim 17, wherein the first thickness and the second thickness are viewed in a vertical plane that is perpendicular to a channel length direction of the plurality of semiconductor strips.

20. The device of claim 17, wherein each of the plurality of oxide layers forms a full ring wrapping around a respective one of the plurality of semiconductor strips.

* * * * *